United States Patent
Patel

(10) Patent No.: US 9,891,827 B2
(45) Date of Patent: Feb. 13, 2018

(54) MULTIPROCESSOR COMPUTING APPARATUS WITH WIRELESS INTERCONNECT AND NON-VOLATILE RANDOM ACCESS MEMORY

(71) Applicant: Sureshchandra B. Patel, Toronto (CA)

(72) Inventor: Sureshchandra B. Patel, Toronto (CA)

( * ) Notice: Subject to any disclaimer, the term of this patent is extended or adjusted under 35 U.S.C. 154(b) by 0 days.

(21) Appl. No.: 14/985,805

(22) Filed: Dec. 31, 2015

(65) Prior Publication Data

US 2016/0117109 A1    Apr. 28, 2016

Related U.S. Application Data

(63) Continuation-in-part of application No. 14/202,306, filed on Mar. 10, 2014, now abandoned.
(Continued)

(51) Int. Cl.
| | | |
|---|---|---|
| *G06F 3/06* | (2006.01) | |
| *G06F 13/10* | (2006.01) | |
| *G06F 13/16* | (2006.01) | |
| *G06F 13/40* | (2006.01) | |
| *G11B 5/09* | (2006.01) | |

(Continued)

(52) U.S. Cl.
CPC .............. *G06F 3/0604* (2013.01); *G06F 1/16* (2013.01); *G06F 1/1613* (2013.01); *G06F 1/1656* (2013.01); *G06F 1/182* (2013.01); *G06F 1/20* (2013.01); *G06F 3/067* (2013.01); *G06F 3/0629* (2013.01); *G06F 13/102* (2013.01); *G06F 13/16* (2013.01); *G06F 13/4068* (2013.01);
(Continued)

(58) Field of Classification Search
CPC ......... G06F 12/0246; G06F 2212/7208; G06F 3/0604; G06F 1/16; G06F 1/1613; G06F 1/1656; G06F 1/182; G06F 1/20; G06F 3/0629; G06F 3/067; G06F 13/102; G06F 13/16; G06F 13/4068; G11B 5/09; H05K 7/20409; H05K 9/002
See application file for complete search history.

(56) References Cited

U.S. PATENT DOCUMENTS

| | | | |
|---|---|---|---|
| 7,788,051 B2 | 8/2010 | Patel | |
| 8,107,924 B2 * | 1/2012 | Robertson | ........... H04L 63/0428 |
| | | | 455/410 |

(Continued)

*Primary Examiner* — Michael C Zarroli

(57) ABSTRACT

A fan-less Multiprocessor-Computing-Apparatus (MCA) housed in a Metallic-Enclosure (ME) acting as an electro-magnetic-Shield for wireless-communications/interconnects (WLI) among components of MCA enabling the whole-range-frequencies from lows of 10-HZs to highs of GHZ and beyond to be able to address almost unlimited Shared-Memory-Units (SMUs) by each processor with each SMU permanently tuned to send/receive data at a particular frequency. The ME is dust-proofed and filled with clean-air/vacuum for efficient-and-reliable WLI. The ME also acts as a heat-sink with the components of MCA placed on Circuit-Boards are mounted on inside in a plane parallel to the respective side of the ME of any required size and shape and heat producing components are firmly attached to the ME, which is waterproofed and placed-under-water for cooling. The SMUs are made up of static non-volatile Random Access Memory that can be read-from and written-to optically.

17 Claims, 25 Drawing Sheets

Related U.S. Application Data

(60) Provisional application No. 61/802,398, filed on Mar. 16, 2013.

(51) Int. Cl.
  *G11B 13/04* (2006.01)
  *H05K 9/00* (2006.01)
  *H05K 7/20* (2006.01)
  *G06F 1/16* (2006.01)
  *G06F 1/18* (2006.01)
  *G06F 1/20* (2006.01)

(52) U.S. Cl.
  CPC .............. *G11B 5/09* (2013.01); *G11B 13/045* (2013.01); *H05K 7/20409* (2013.01); *H05K 9/002* (2013.01)

(56) References Cited

U.S. PATENT DOCUMENTS

| | | | | |
|---|---|---|---|---|
| 8,341,332 | B2* | 12/2012 | Ma | G06F 3/0613 |
| | | | | 711/103 |
| 8,976,010 | B2* | 3/2015 | Pagani | G06K 7/10178 |
| | | | | 235/492 |
| 9,128,118 | B2* | 9/2015 | Haylock | G01R 1/04 |
| 9,346,397 | B2* | 5/2016 | Gergets | B60Q 1/2611 |
| 2007/0109208 | A1* | 5/2007 | Turner | H01Q 1/273 |
| | | | | 343/718 |
| 2008/0186137 | A1* | 8/2008 | Butler | G06K 19/0723 |
| | | | | 340/10.1 |
| 2009/0289776 | A1* | 11/2009 | Moore | G06K 7/0008 |
| | | | | 340/10.41 |
| 2010/0097767 | A1* | 4/2010 | Jude | H05K 7/20409 |
| | | | | 361/709 |
| 2012/0331269 | A1 | 12/2012 | Aras | |

* cited by examiner

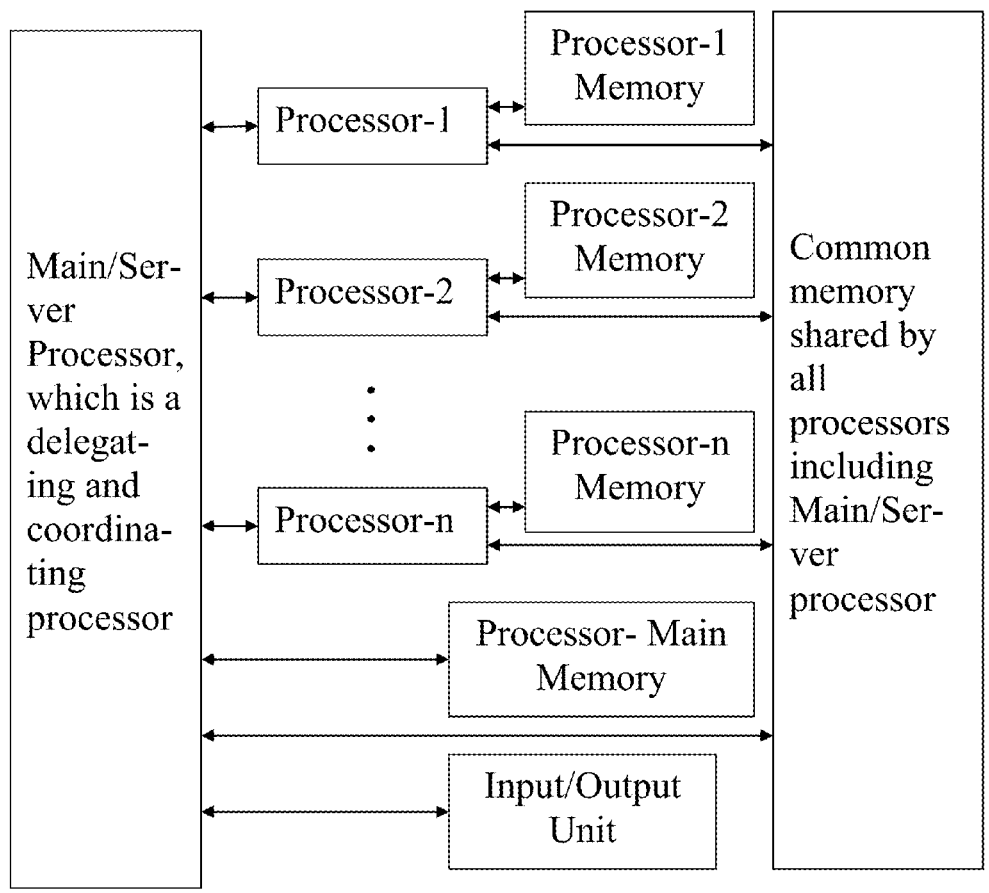
Fig.1a: Prior Art Parallel Computer Architecture/organization

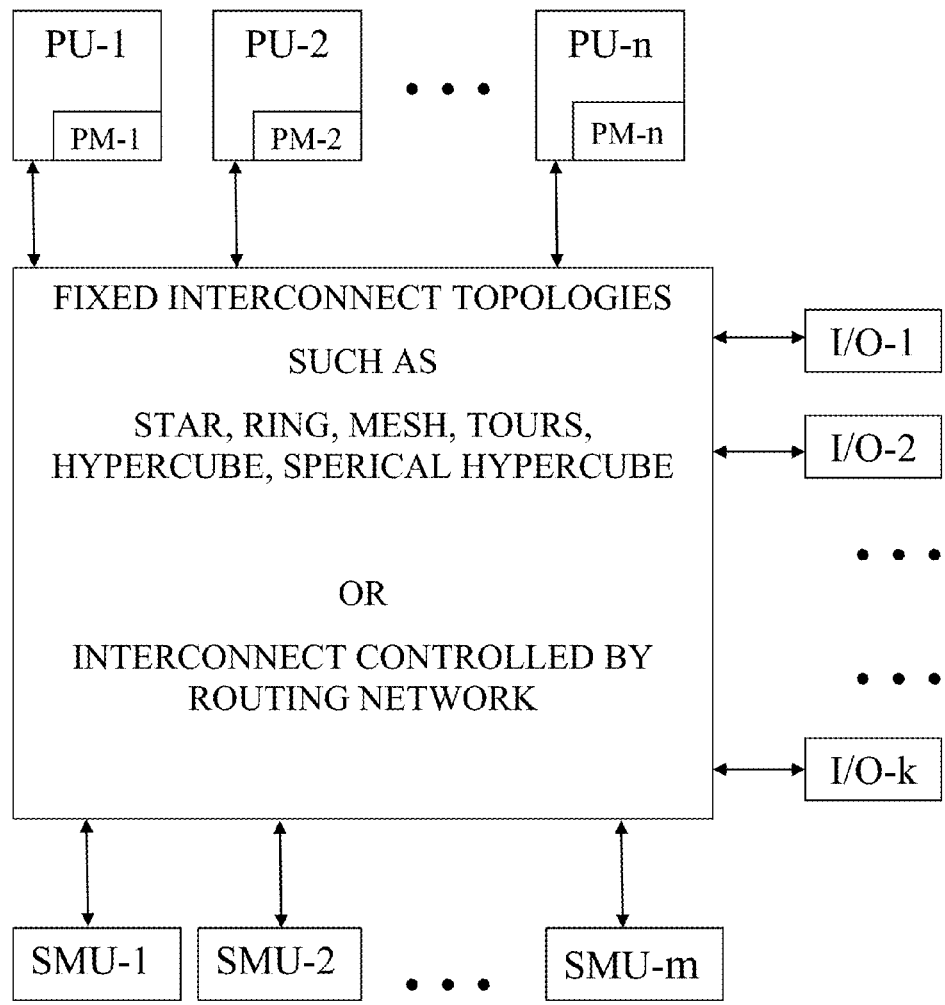
Fig.1b: Prior Art Interconnect

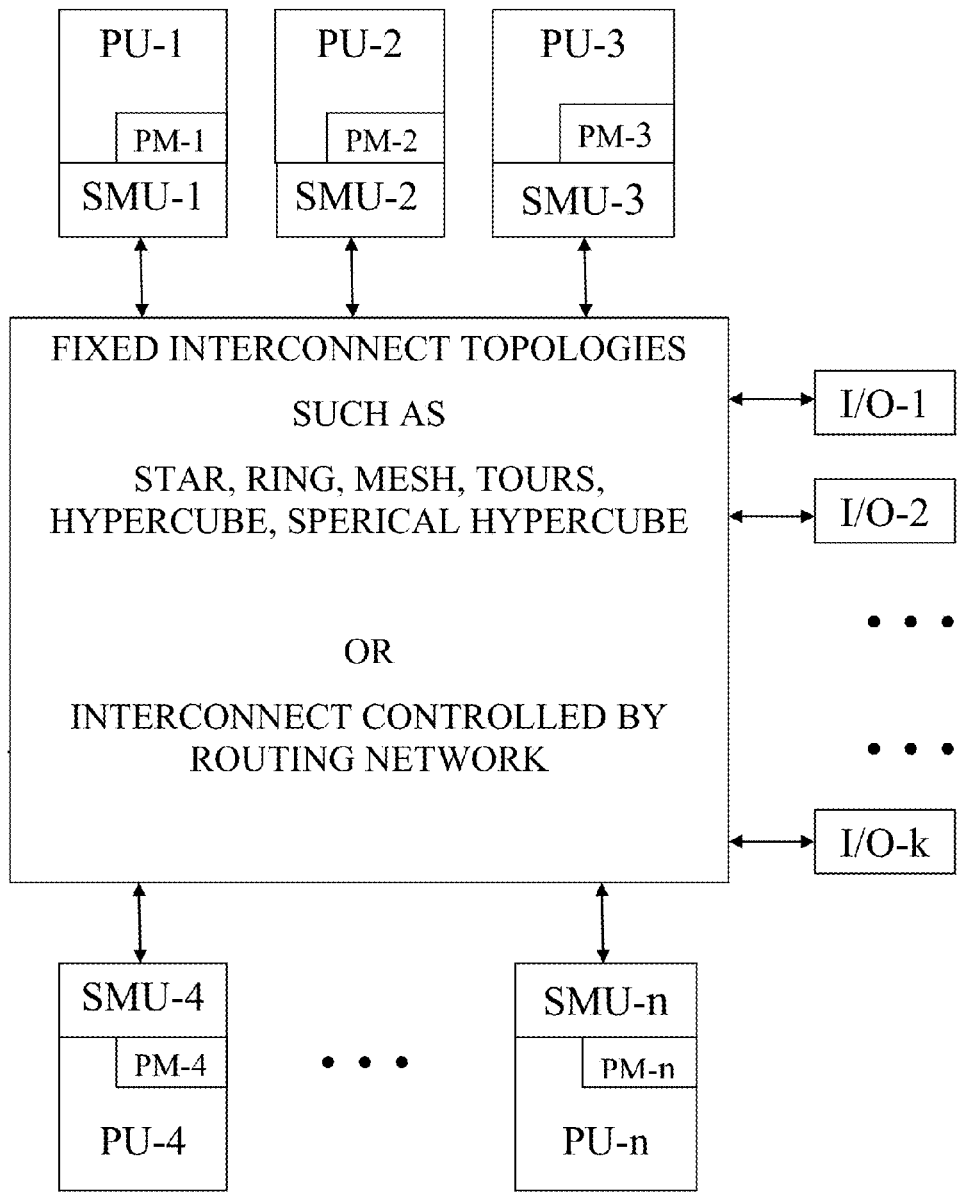
Fig. 1c: Prior Art Interconnect

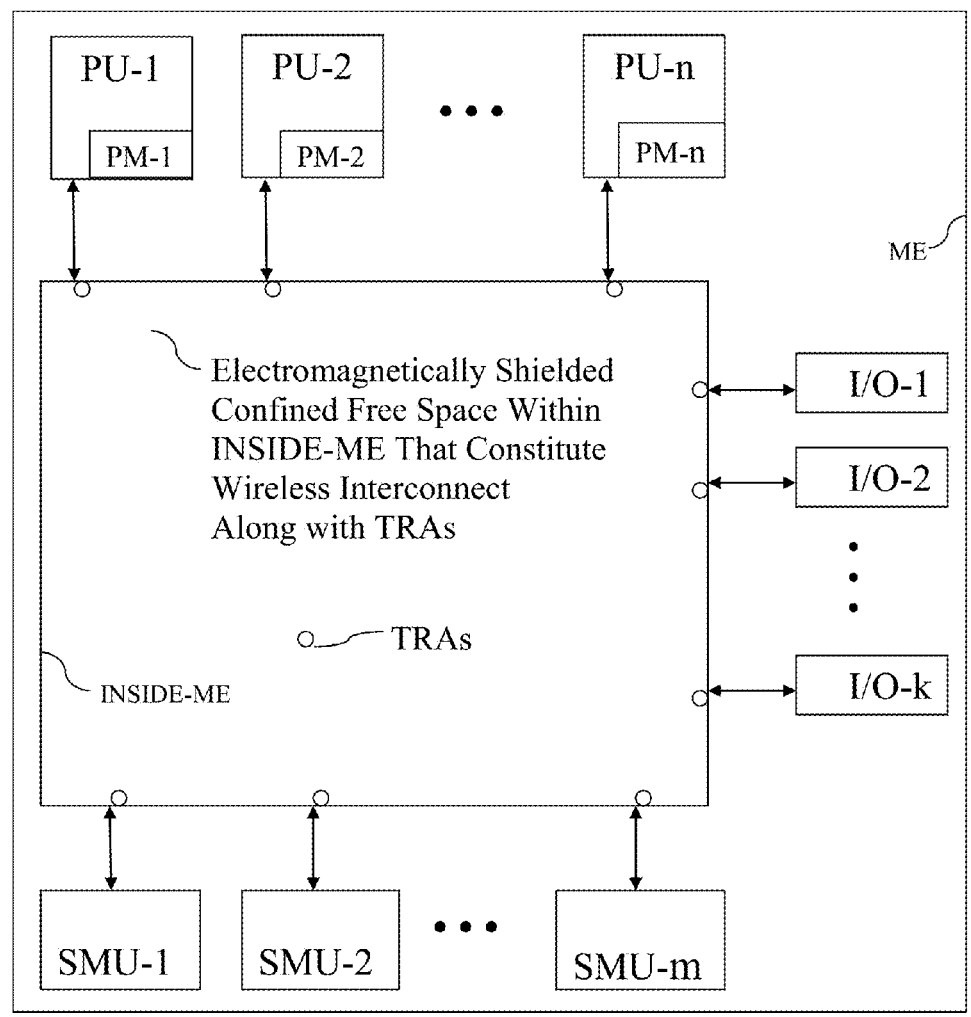
Fig.2a: Invented Wireless Interconnect

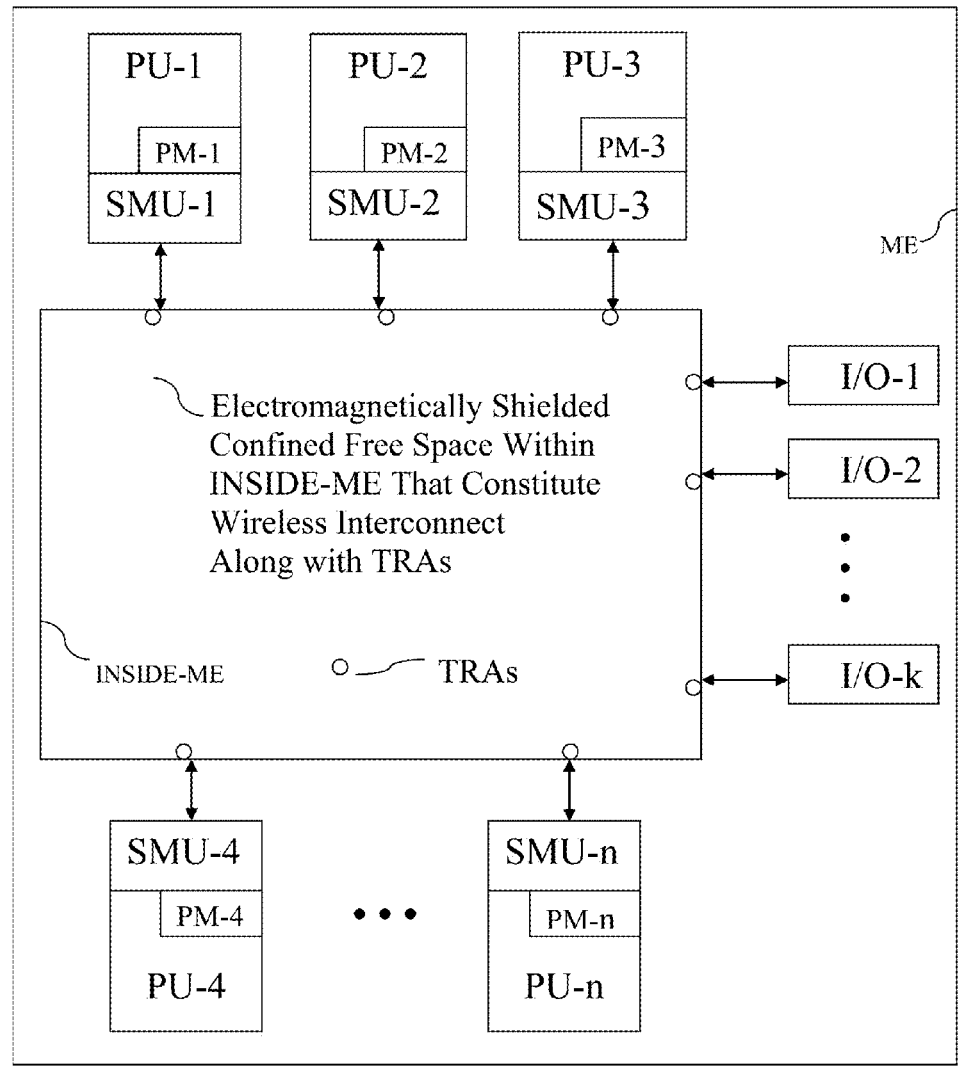
Fig.2b: Invented Wireless Interconnect

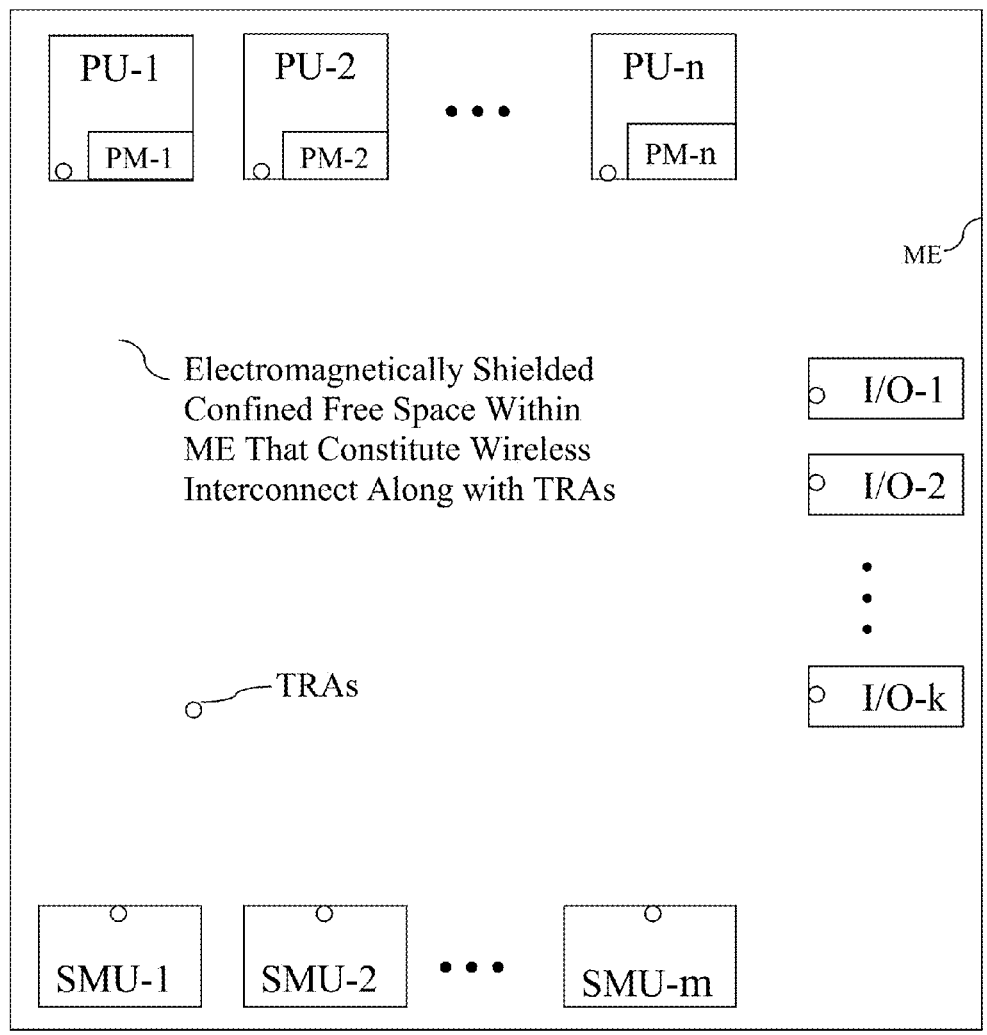
Fig.2c: Invented Wireless Interconnect

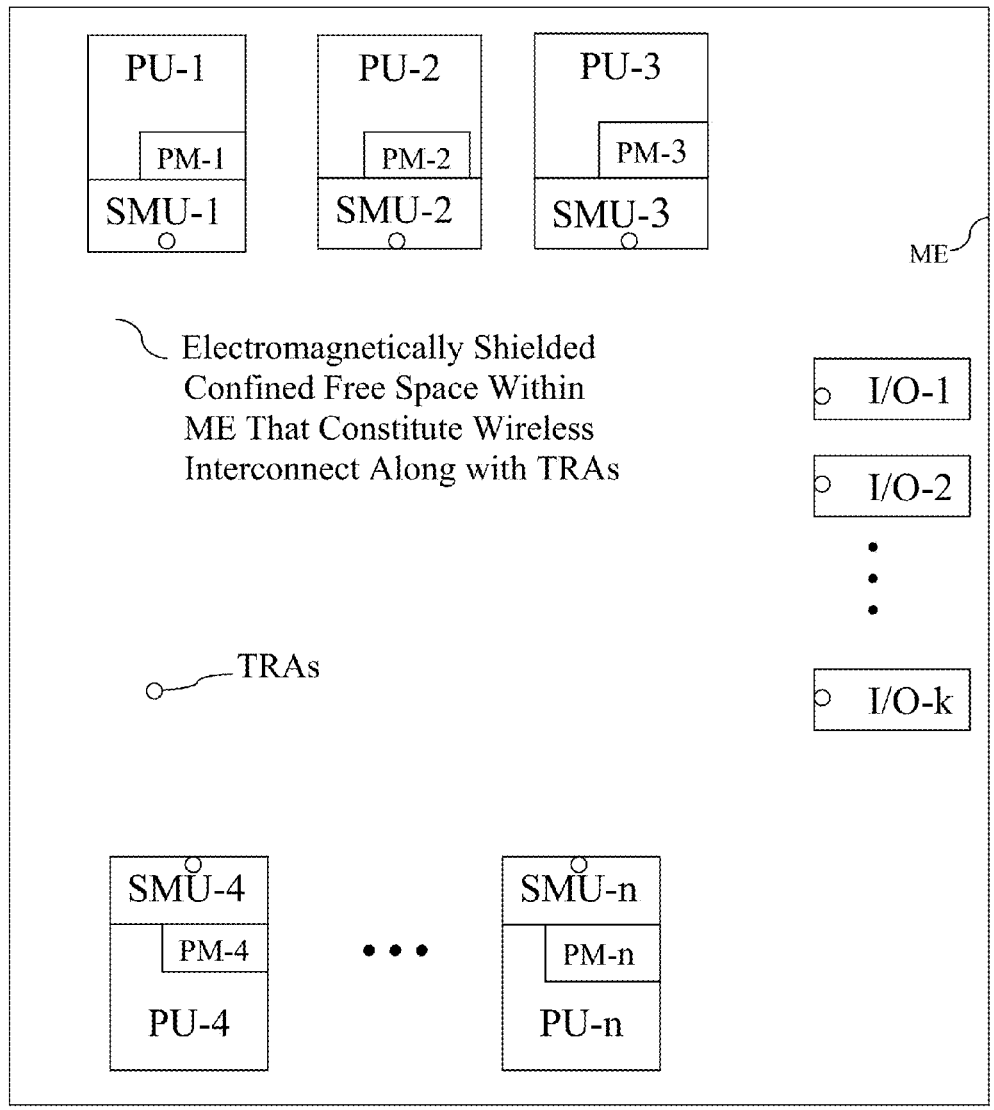
Fig.2d: Invented Wireless Interconnect

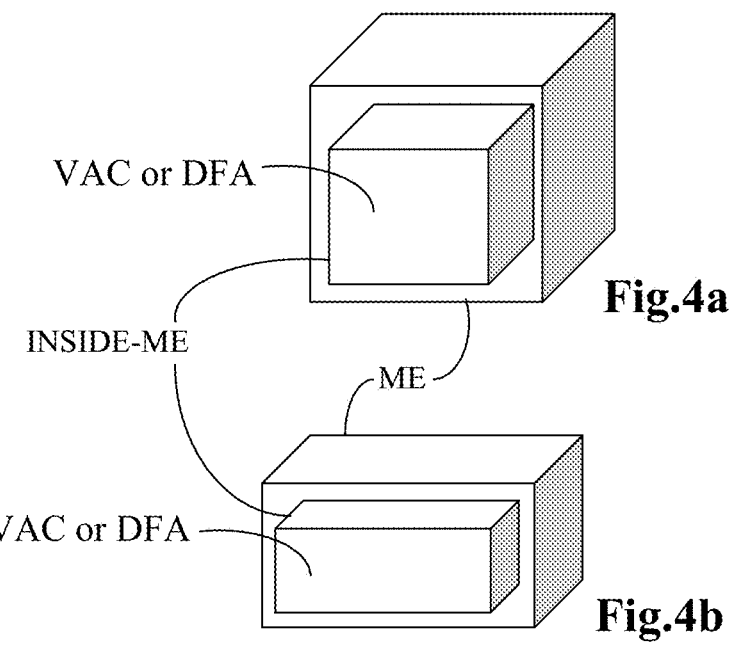
Fig.4a
Fig.4b
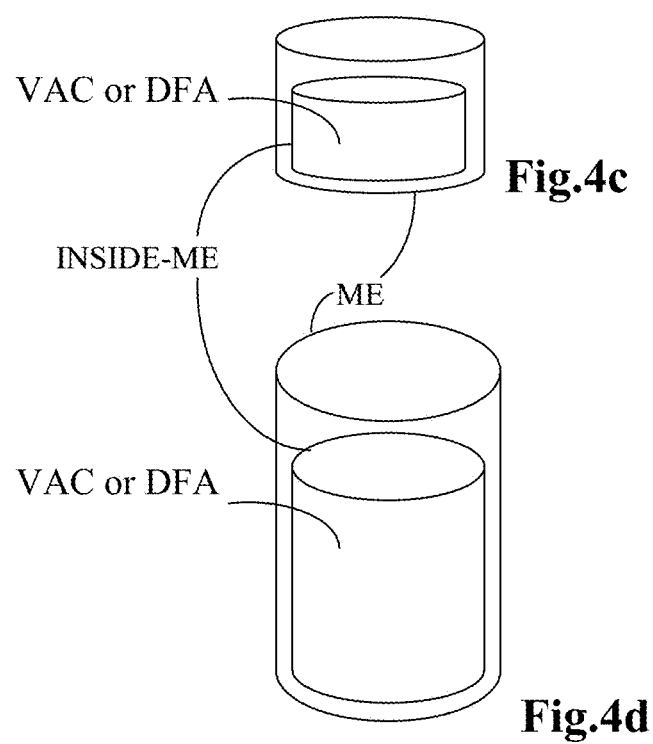
Fig.4c
Fig.4d

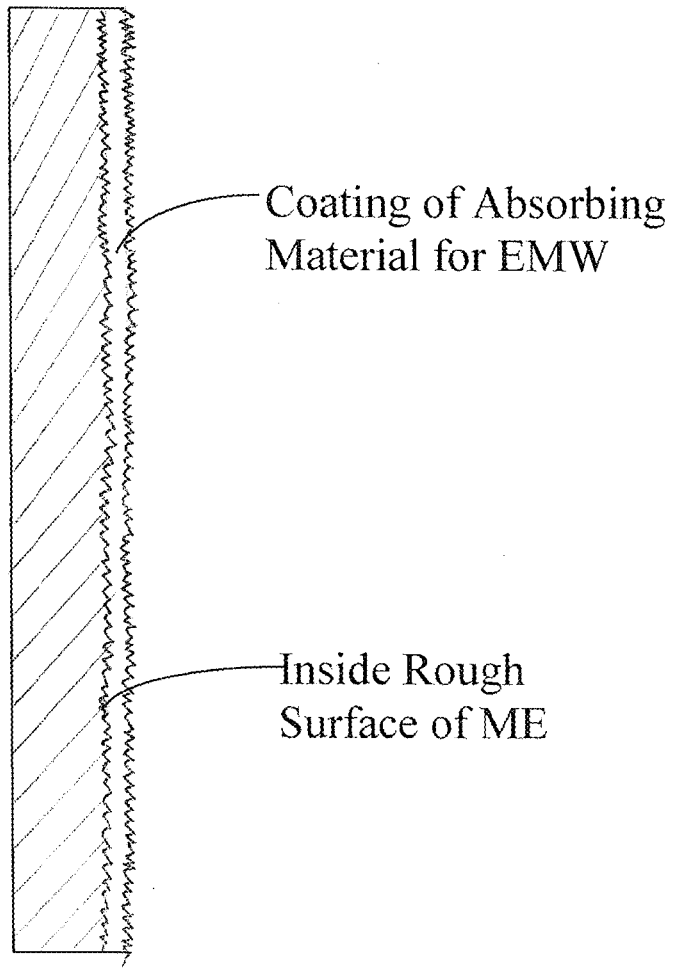
Fig.9: Cross Section one side of ME

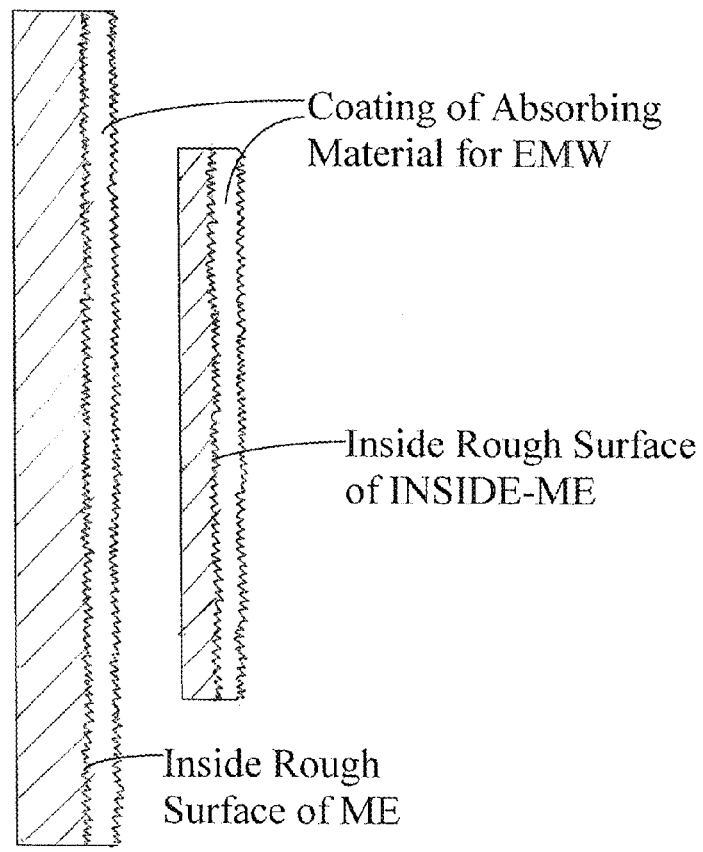
Fig.10: Cross Section one side of ME and INSIDE-ME

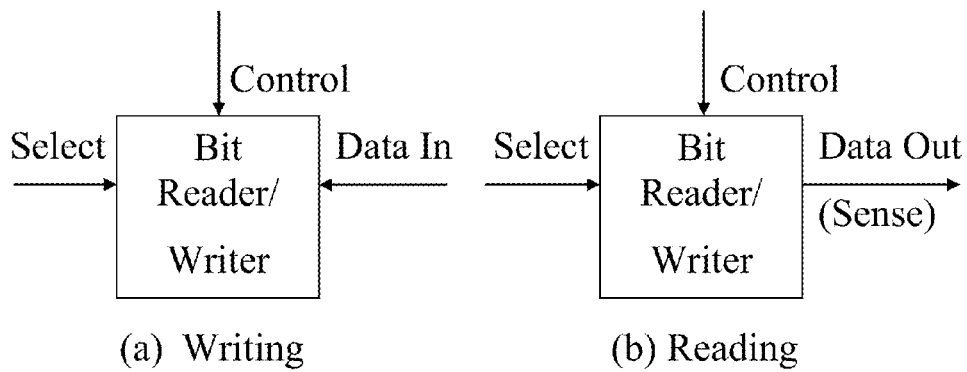
Fig.11 Memory bit Read/Write Operation
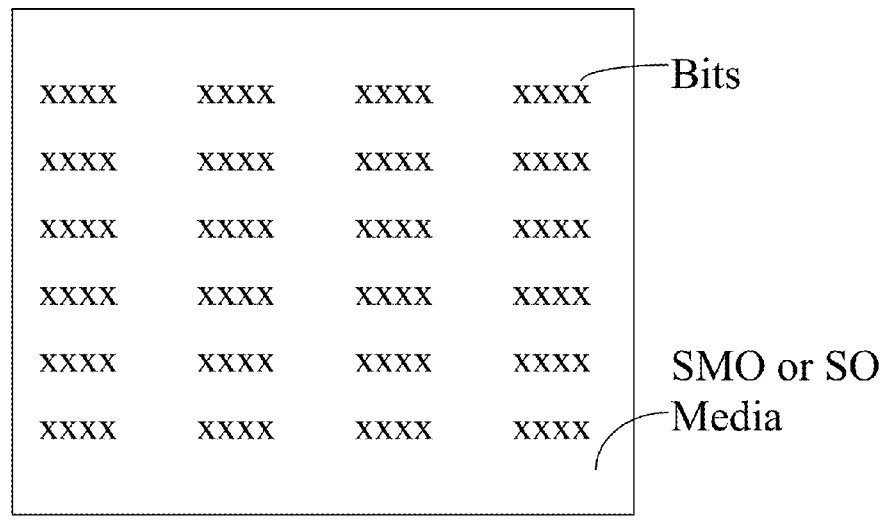
Fig.12 SMO or SO Memory Organization

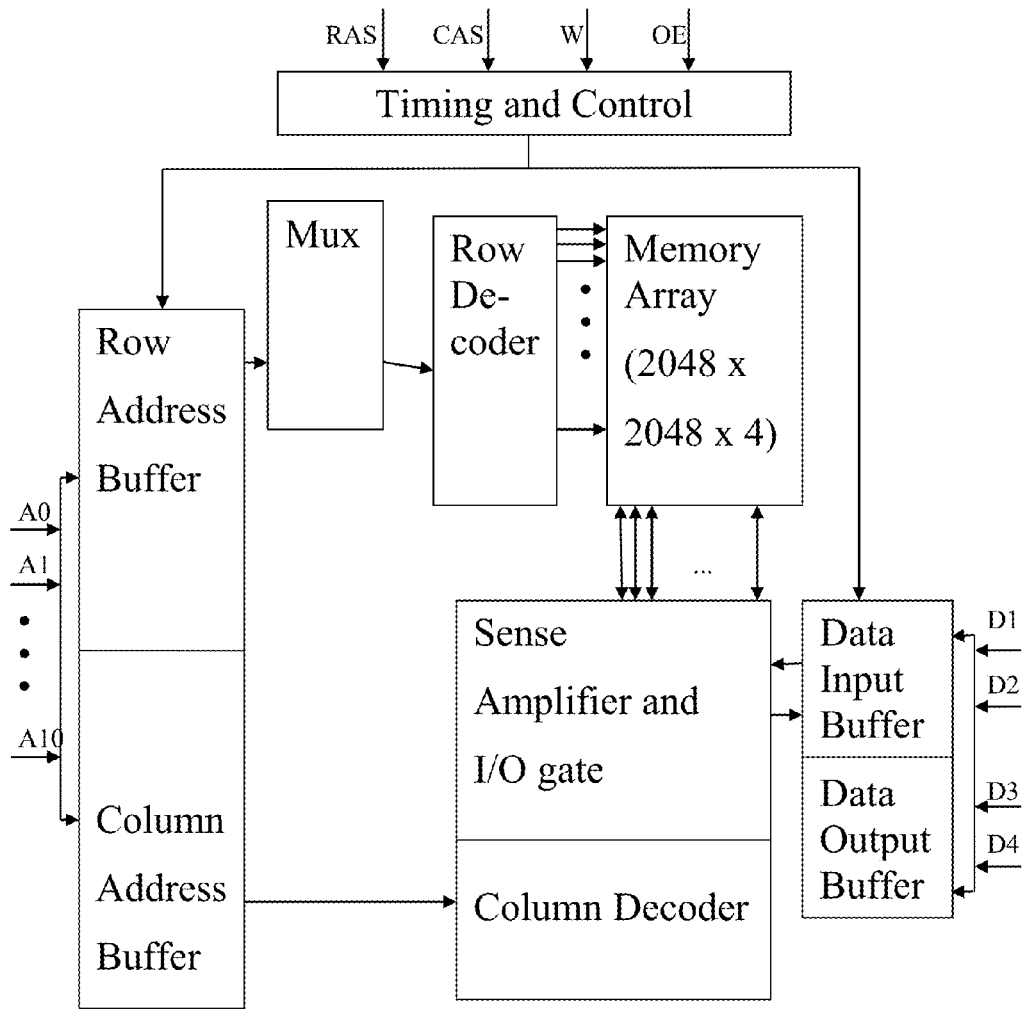
Fig.13: Typical Access Mechanism for 16 Megabit SMO or SO RAM (4M x 4)

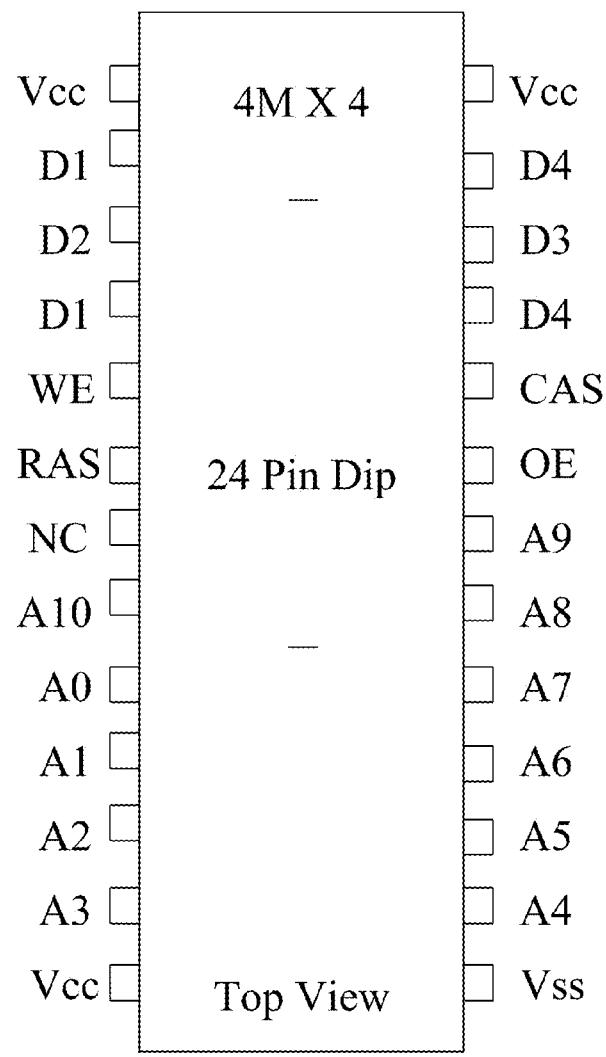
Fig.14: 16 Megabit SMO or SO RAM Package Pins and Signals

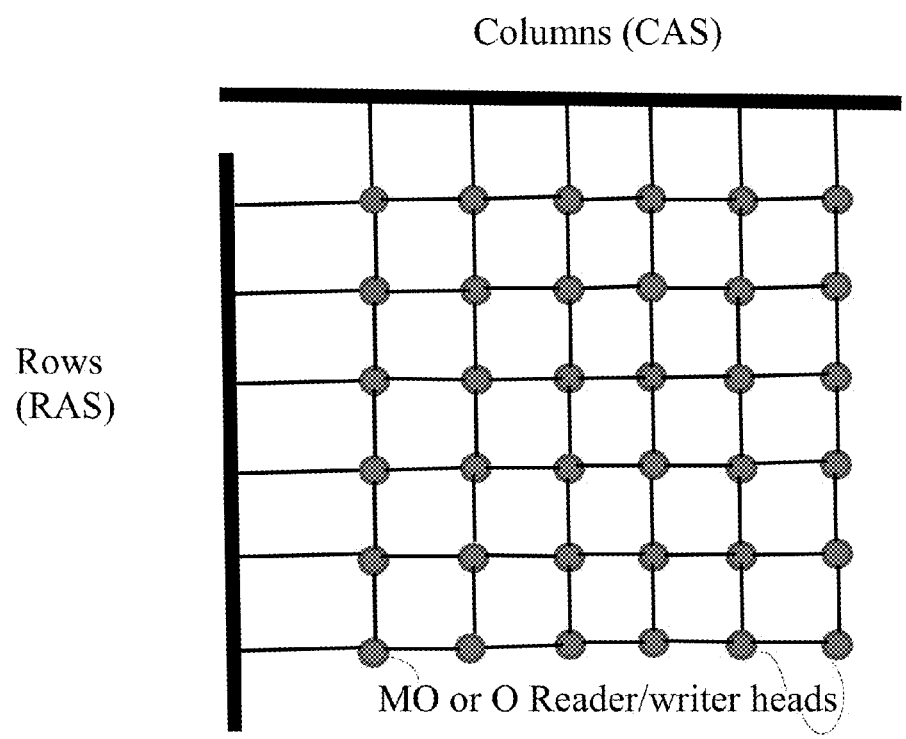
Fig.15: Two-Dimensional Grid of Magneto-Optical (MO) or Optical (O) bit Reader/Writer heads

MULTIPROCESSOR COMPUTING APPARATUS WITH WIRELESS INTERCONNECT AND NON-VOLATILE RANDOM ACCESS MEMORY

TECHNICAL FIELD

The present invention relates to a Multiprocessor Computing Apparatus (MCA) comprising each of the multiprocessors referred to as Processing Units (PUs), each of shared resources such as Shared Memory Units (SMUs), interface circuits of peripheral components and inputs/outputs (I/Os), and wireless interconnect (WLI) for communication among PUs and shared resources that are components of MCA. Specifically, the invention relates to two components of MCA that are SMUs and WLI.

BACKGROUND OF THE INVENTION

Switching speed of transistors and diodes improve over each technology generation of shrinking geometries and increasing integration density or scaling of Complementary-Metal-Oxide-Semiconductor (CMOS) Integrated Circuits (ICs). As per International Technology Roadmap for Semiconductor (ITRS) for the year 2010, the cut-off frequency of switching is expected to be of the order of 600 GHZs in 16 nm CMOS technology leading to the availability of hundreds of GHZs bandwidth in the near future.

ICs are networks/circuits in packages interconnecting thousands or millions or billions of discrete electronic components like transistors, diodes, resistors, capacitors etc. depending on Small Scale Integration (SSI) or Large Scale Integration (LSI) or Very Large Scale Integration (VLSI). However, increasing clock frequency for operation of ICs in a push for faster computation, power lost as heat in components like transistors due to switching, and Metallic Interconnects (MIs) due to skin effect, and propagation delays due to Resistance-Capacitance (RC) time constants in MIs connecting discrete electronic components increases particularly in LSI and VLSI degrading performance. Increasing clock frequency for the operation of digital ICs, increases the self-inductance (L) and therefore self-reactance ($X_L=2\pi fL$) of MIs. However, central core portion of the MI experience greater L and $2\pi fl$ pushing current to flow through the outer periphery of MI known as the skin effect. Because of the skin effect, pulsating current flowing through MIs experience increased Impedance ($R+jX_L$), and therefore increased $I^2R$ losses as heat in MIs.

Modern computing apparatus is composed of various ICs mounted on Mother Printed Circuit Board and if required additional add on Printed Circuit Boards (PCBs). PCBs usually of plastic material printed with traces of copper connecting various discrete components and pins of ICs, wherein copper traces are narrow, densely laid for communication of data, addresses, and control signals, and power supply to and from various ICs. Again, increasing frequency of operation of ICs in a push for faster computation, RC time constants of, power lost as heat due to skin effect in, and crosstalk called Inter Symbol Interference (ISI) due to parasitic inductances (L) among, long usually copper MIs connecting ICs increases degrading performance of an apparatus or a device or a system.

Therefore, global clock frequency and data rates within/intra and among/inter IC chips are limited to below about 6 GHZs. Scaling of MIs along with scaling of ICs in LSI/VLSI has degraded the performance of the LSI/VLSI in terms of operating clock frequency and data rates, and power consumption. With the increasing integration density and cut-off switching frequency of transistors in CMOS ICs, the MIs technology is emerging as a major bottleneck to the performance improvement of VLSI such as System-on-Chip (SoC), System-in-Package (SiP), and Network-on-Chip (NoC). This performance bottleneck is due to the global interconnection delays becoming significantly larger than the gate switching delays. Carbon nano-materials based Carbon Nano-Tubes (CNTs) and Graphene Nano-Ribbons (GNRs) are emerging as next-generation interconnect technology referred to as Carbon Interconnects (CIs) that has the potential to resolve the most problems of MIs. However, according to ITRS, only material innovations like CNTs and GNRs will lead to a brick wall that can only be overcome by radically different interconnect architectures based on other forms of technology scaling.

The MCA has evolved to have as many number of units of shared memory as number of processors. This is in order to facilitate simultaneous access of different units of shared memory by different processors for reducing latency and contention for shared memory. This approach has followed from FIG. 4 (FIG. 1a in this application) of the Best Possible Parallel Computer Architecture (BPPCA) claimed in the technologically disruptive U.S. Pat. No. 7,788,051 and Canadian Patent #2564625 titled "Method and Apparatus for Parallel Loadflow Computation for Electrical Power System", where each processor has been shown to connect to a box of shared memory leading to an idea that shared memory can be divided into as many SMUs as the number of processors, and then provide interconnect to increase shared memory bandwidth. Canadian Patent #2564625 provides figures each completely contained in a single A4 size paper as originally provided by this inventor. So far the trend has been to put as many processors along with their Private Memories (PMs) and SMUs on a single chip with MIs and associated switches constituting what is called System on Chip (SoC). However, this arrangement can introduce substantial delays in accessing data from a SMU located at the other end across the chip by a processor at the one end, because data has to take several 'hops' through MIs and associated switches.

Parallel Gauss-Seidel-Patel Loadflow (PGSPL) when implemented on BPPCA claimed in the U.S. Pat. No. 7,788,051 and the Canadian Patent #2564625 titled "Method and Apparatus for Parallel Loadflow Computation for Electrical Power System", ignoring all communication delays was estimated to speed-up by a factor of 10 for the first time in the parallel computation history, and that marked the beginning of the new era of computer technology. Historically, parallel computing produced speed-up at the most about 3-times. Any attempt to further speed-up by a factor greater than 3 was not successful even by increasing number of computers in parallel. The speed-up/scaling bottleneck was due to the techniques of decomposing a big computational problem into small sub-problems and the parallel computer architecture were not very well tuned, requiring huge moving around of computational data. The PGSPL method and BPPCA are very well tuned for minimum communication and synchronization requirements, and almost removed the speed-up/scaling bottleneck bringing about the state of "NIRVANA" for parallel computing in general. The minimum synchronization requirement is realized by making parallel processing locally asynchronous and globally synchronous. The BPPCA is scalable in the sense that it can have just two processors to thousands of processors all working in parallel. What followed was proliferation of many/multi-core computers, supercomputers with massive number crunching capabilities; massively parallel cloud computing machines or data centres. The envelop of technology is being pushed towards utility computing and ultimately putting all automated cloud computing machines (MCAs) in the outer space or on the other planets preferably on the Moon to begin with as per the case made by this inventor in his Canadian patent application #2743882, titled "System of Internet for Information/Data Processing, Storage, and Retrieval" completed on May 28, 2012.

Modern complex Electrical Power Utility System is composed of millions of tiny light bulbs to thousands of huge motors and generators all connected in parallel for operational convenience in the sense that each component from tiny light bulb to huge motor/generator can be individually turned on/off without disturbing the rest of the system. The evolution of single generator supplying single light bulb or a group of light bulbs into the modern complex Electrical Power Utility System is believed to have taken more than a century.

All automated cloud computing machines can be placed in the outer space or on the other planets preferably on the Moon to begin with for the following reasons.

1. Traditionally, scientists/engineers thought hard about the possibility of generating electricity in the outer space and transmitting on the earth for our use. Huge cloud computing machines consume lots of electricity that can be generated in the outer space and used there for running the cloud computing machines by deploying them in the outer space, and connecting them through wireless links to earth stations, which are connected to internet. Resources required for generating electricity for running the cloud computing machines and its impact on environment on the earth can be saved.
2. While machines can live, and work almost anywhere, life as we know it cannot be sustained in the outer space unless we learn to live there through technological innovations.
3. So far, Earth is the only planet known to be capable of sustaining life. Even in the desert precious air is available and water can be managed from other areas. Real estate earth is at premium for life and must not be spoiled as far as possible particularly when the cloud computing machines are capable of being deployed in the outer space.
4. The Moon to begin with provides naturally stable platform in the outer space for deployment of huge cloud computing machines. The Moon futuristically can be visualized as knowledge/information/data processing/ storage/retrieval warehouse/library for humans on the earth.
5. Peeking deep into the future, the first thing needed is to construct a space highway when we are ready to travel deep into the outer space. The cloud computing machines can be used as mile (in terms of space distances) stones on the space highway. Spaceship of the kind of enterprise spaceship of Star Trek could be utilized in almost never ending process of constructing the space highway deeper and deeper into the outer space and deploying the cloud computing machines as mile stones. Travel on the already constructed space highway could be 'Travel Light' because new spaceship will not be required to carry bulky computing machines on board.
6. The concept of the cloud computing machines as mile stones or any other similar can be used in making highways/railways on the earth intelligent/smart.

High Performance Computing (HPC) or Supercomputing has found its way into mainstream following recent advances in parallel computing technologies particularly influenced by developments of U.S. Pat. No. 7,788,051. Every advance in computing technology has always been followed by increased expectations and demands for enhanced computational power. Usually the domain of science and technology, HPC has become increasingly pervasive among industries, businesses, and governments. Wireless communication in atmospheric free space is regulated by governments and requires licensing and standardization of a range of frequencies (a spectrum) for a particular use. This invention is about Wireless Interconnect (WLI) comprising Transceiver-Antenna (Transmitter-Receiver-Antenna) TRA mounted/fabricated/integrated/embedded on each of the multiprocessors and shared resources, and electromagnetically shielded and sealed confined free space within Metallic Enclosure (ME) housing MCA.

As per statements in US patent application publication 2012/0331269 titled "Geodesic Massively Parallel Computer", different modern MCA share similar packaging, construction, and connectivity implementation hierarchy. That is: assemble component ICs onto PCBs, PCBs into racks, racks into cabinets, and cabinets into rooms. Typical communication channels are printed circuits on boards and backplanes, with electrical and fibre optic cabling running over longer distances. Processor-clusters communication in and between cabinets of massively parallel systems is typically cabled packet switched networks such as Infiniband or Ethernet. So far, all the arrangements have been the use of various physical interconnects networks for multiple processors, multiple SMUs, multiple inputs/outputs (I/Os) and other shared resources in MCA. Physical topologies of interconnection networks are typically star, ring, mesh, torus, hypercube, spherical hypercube, and other variants including interconnect controlled by routing and switching network as per FIG. 1b and FIG. 1c.

Further, The current status of the rewritable Magneto-Optical (MO) and Optical (O) memories is that they are available in the form of rewritable Compact Disks (CD-RWs) and Digital Video Disks (DVD-RWs) and they need to be rotated using CD/DVD-drives in order to be able to read from and written to by a computer.

Some Definitions mounted/fabricated/integrated/embedded: This phrase means mounted or fabricated or integrated or embedded with and provide alternative descriptive terms.

Mounted with: means TRA is made as a separate physical device and mounted on top of or beside of the device IC to which it needs to be connected electrically.

Fabricated or integrated or embedded with: These are alternative terms meaning essentially the same thing. It means TRA is made part of a device or a component and manufactured as a single piece IC.

ME: Metallic Enclosure (outside metallic enclosure).

INSIDE-ME: Inside Metallic Enclosure means it is placed inside or within the ME (outside metallic enclosure). The ME also acts as a heat sink for components of a MCA or an apparatus or an equipment or a device. Printed circuit boards (PCBs) mounted with component ICs and other discrete electronic components are mounted on inside walls or sides of the ME in a plane parallel to the respective wall or side of the ME. Walls of the ME support weight of all components including INSIDE-ME of a MCA or an apparatus or an equipment or a device, in addition to being heat sink, they are stronger, sturdy and thicker.

ALL-TO-ALL Communication is collective operations in which every component of a MCA or an apparatus or an equipment or a device both sends data to and receives data from every other component. Two widely used operations are all-to-all personalized communication and all-to-all broadcast. This definition includes wireless communication in all situations including anywhere there is no interference.

Scattering: The process in which a wave or a beam of particles is diffused. To separate and disperse irregularly so as to diffuse in many directions weakening the strength of the wave or the beam of particles.

Reflection: A cast back of light, heat, sound etc. from a surface to give back. Yes, reflection will mean a more limited dissemination of wave and therefore stronger.

Rough Surface: A rough surface can be created one or any combination of the following four ways for the purpose of absorbing, scattering and reducing reflection of impinging Electromagnetic communication signals by:
1. having minute bumps and/or pores on the surfaces.
2. sticking specially prepared Sponge, which is rough, porous, and soft, on the smooth surfaces.
3. covering the surfaces with one, two, or more layers of coarsely woven soft, flexible, and thin fabric having pores between weaves, and the fabric could be made up of very fine, thin, and soft threads of cotton, synthetic, nylon, plastic, rubber or any metallic material.
4. covering the surfaces with one, two, or more layers of mosquito net type soft and flexible thin fabric having holes of the net misaligned with respect to each layer, and the fabric could be made up of very fine, thin, and soft threads of cotton, synthetic, nylon, plastic, or rubber or any metallic material.

Aim is to create very soft and flexible rough fabric surface so that impinging Electromagnetic waves do not face hard and stiff surface and get reflected strongly while being absorbed and scattered by rough and porous surface.

Processing Unit (PU): A PU can be a Central Processing Unit (CPU) or a Graphical Processing Unit (GPU) or a Field Programmable Gate Array (FPGA) or an application specific Processing Unit (ASPU) like Tensor Processing Unit (TPU)

SUMMARY OF INVENTION

As said before, ICs are networks/circuits in packages interconnecting thousands or millions or billions of discrete electronic components like transistors, diodes, resistors, capacitors etc. depending on level of integration such as SSI or LSI or VLSI using MIs or next-generation evolving CIs. However, integration of discrete electronic components is carried out to create various functional blocks and storage blocks/units in VLSI such as SoC, SiP, NoC etc. The best approach appears to be scaling of MIs or emerging CIs only to a point of formation of each functional block and/or storage block, and then providing Wireless Interconnect (WLI) involving TRAs for communication among various functional and/or storage blocks. That is to say, intra-functional block uses MIs or emerging CIs, and inter-functional blocks use WLIs involving TRAs. The definition of functional block can vary from designer to designer. For example, a functional block can further be divided into sub-functional blocks and providing MIs or CIs for communication within/intra sub-functional blocks and WLIs involving TRAs for communication among/inter sub-functional blocks as per FIG. 8b along with WLIs involving TRAs among/inter functional blocks. There are two extremes to this approach: at one end, there are no WLIs involving TRAs used as per current status of the interconnect technologies, and at the other ideally there are no MIs or CIs used. Hopefully, the other extreme end, wherein interconnect technology that do not use MIs or CIs at all will soon be reached. The WLIs involving TRAs technology has advantages of re-configurability, system scalability/expandability, and fault tolerance, which are not possible with fixed wire-line MIs or CIs. At the system level fault tolerance can be achieved by software commands to debug and then to eliminate the faulty chips via reconfiguration. Moreover, MIs or CIs using physical "wired" channels for data transport do not resolve the difficult problem of routing the interconnect because they involve consequent time delaying and power consuming switching operations, whereas, WLIs involving TRAs make it possible for every functional block to be able to communicate directly with all others at the speed of light, which is the highest possible. Particularly every processor of MCA can access every unit of shared memory directly with WLIs involving TRAs. Therefore, while allowing for material innovations like CNTs and GNRs for intra-functional CIs, and by using WLIs involving TRAs for inter-functional communication, the present invention attempts to overcome a brick wall by radically different interconnect architectures based on other forms of technology scaling as described in the following. While cut-off switching speed of transistors is expected to be 600 GHz for the next 16 nm technology generation, it may be possible to raise the operational clock frequency of MCAs to 10 GHz and much higher with technology scaling of the present invention along with the use of CIs for intra functional communications.

It is the primary object of the present invention to introduce wireless interconnects for communication among various components of Multiprocessor Computing Apparatus in order to dramatically reduce latency and contention for shared resources for the purpose of parallel processing. MCA comprises 2 or more processors, and sometimes of the order of thousands or millions of processors in case of massively parallel computing apparatus, each processor having local private memory (PM), and an access to shared memory divided into SMUs, and also access to other shared resources including I/Os devices.

For the purpose of this invention, electro-magnetically shielded and sealed Metallic Enclosure (ME) also acting as heat sink for the Multiprocessor chips and other heat producing chips without requiring any noise producing cooling fans inside enclosed space that provides means for implementing wireless interconnect for communication among components of MCA. Wireless interconnects can use whole range of radio, microwave, and optical frequencies, and use antennas along with transceiver mounted/fabricated/integrated/embedded on components of MCA. The whole range of radio, microwave, and optical frequency ranges from lows of 10s HZs to highs of GHZs and beyond. Optimized size MCA can be used as building blocks for constructing data centres or cloud computing centres.

The WLI comprises Transmitter-Receiver-Antenna (Transceiver-Antenna:TRA) mounted/fabricated/-integrated/embedded on each of the multiprocessors and shared resources, and electromagnetically shielded and sealed confined free space within Metallic Enclosure (ME) housing MCA. The ME is made up of pure or alloyed metal that is very good conductor of both heat and electricity. The invention is in general about wireless communication within electromagnetically shielded and sealed confined free space that is part of any apparatus, equipment, or device including MCA. WLI can use the whole range of frequencies that can be generated by oscillators of transceivers for transmitting and receiving information to achieve communication among components of MCA. The whole range of frequencies involves the range from lows of 10s HZs to highs of GHZs and beyond. The use of WLI involving TRA makes it possible for each Processing Unit (PU) of MCA to be able to address large number of SMUs because an address for each of SMUs is the frequency to which its transceiver is permanently tuned to send and receive information/data. A significant achievement of this invention is that each processor of MCA is capable of addressing almost unlimited shared memory. The smallest SMU could be consisting of a single addressable memory location. That means in a best possible scenario each processor of MCA can reach and communicate with every single addressable memory location directly.

This invention is synergistic extension of the U.S. Pat. No. 7,788,051 and the Canadian patent no, 2564625 where this inventor has claimed a technique of decomposing a big problem into small sub-problems and the corresponding BPPCA leading to estimated 10-times speedup in the solution of Simultaneous Nonlinear Power Flow equations ignoring communication and contention for access delays between PUs and SMUs. The invention claimed in this application is the result of constant intellectual and mental struggle for achieving fastest possible communication between processors and SMUs. Assisted by advanced signal processing techniques such as equalization, echo/crosstalk cancellation, and error correction coding, the performance of WLI involving TRAs is expected to continue advancing at a steady pace.

The invented WLI involving TRAs provides all-to-all direct communication links between components of MCA regardless of their topological distances. Without packet/circuit switching, WLI involving TRAs eliminates intermediate routing and buffering delays and makes signal propagation delay approach the ultimate lower bound: the speed of light. WLI involving TRAs links can operate at much higher speed than core logic making it easy to provide high throughput. In WLI involving TRAs, line of sight communication channels are built directly between communicating nodes within a network in a total distributed fashion without arbitration. An important consequence is that packets destined for the same receiver will collide. Such collisions require detection, retransmission, and extra bandwidth margin to prevent them from becoming a significant issue. The WLI involving TRAs allows errors and collusions to be handled by the same mechanism essentially requiring no extra support than needed to handle errors, which is necessary in any system.

It is also, the primary object of the present invention to introduce Universal Computer Memory for information storage and retrieval. The Universal Computer Memories are Static Magneto-Optical (SMO) and Static Optical (SO) memories that can be accessed in the same manner as currently used semiconductor Random Access Memories (RAMs). The SMO and SO RAMs are Non-Volatile Random Access Memories (NVRAMs), cheap, and consume much less power than semiconductor RAMs. Universal Computer Memory can also be made up of any media that can be written to and read from using laser (optical) read/write mechanism without requiring rotational or any other motion. It is called Universal Computer Memory in the sense that it can be used to make main computer memory similar to semiconductor RAM, and it can also be used to make bulk storage devices like hard drives.

BRIEF DESCRIPTION OF DRAWINGS

FIG. 1a is the prior art Parallel Computer Architecture/organization wherein each processor or PU is having its own Private Memory (PM) such as Processor-1 Memory, Processor-2 Memory, . . . Processor-n Memory and common memory shared by all processors referred to as Shared Memory Unit (SMU) and Input/Output (I/O) unit shared among all PUs.

FIG. 1b is the prior art Parallel Computer Architecture/organization with prior art fixed interconnect topologies such as star, tree, ring, mesh, tours, hypercube, spherical hypercube, and other variants or an interconnect controlled by routing and switching network.

FIG. 1c is another arrangement of the prior art Parallel Computer Architecture/organization with prior art fixed interconnect topologies such as star, tree, ring, mesh, tours, hypercube, spherical hypercube, and other variants or an interconnect controlled by routing and switching network.

FIG. 2a is the prior art Parallel Computer Architecture/organization with invented Wireless Interconnect (WLI) involving TRA realized in an electromagnetically shielded and sealed enclosed free space within INSIDE-ME.

FIG. 2b is another arrangement of the prior art Parallel Computer Architecture/organization with invented Wireless Interconnect (WLI) involving TRAs realized in an electromagnetically Shielded and sealed enclosed free space within INSIDE-ME.

FIG. 2c is the prior art Parallel Computer Architecture/organization with invented WLI involving TRAs realized in an electromagnetically shielded and sealed enclosed free space within ME housing MCA.

FIG. 2d is another arrangement of the prior art Parallel Computer Architecture/organization with invented WLI involving TRAs realized in an electromagnetically shielded and sealed enclosed free space within ME housing MCA.

FIG. 4a is the cubical ME housing MCA, and INSIDE-ME filled with Vacuum (VAC) or Dust Free Air (DFA), and each of whose dimensions increase and decrease for increased or decreased size of a MCA, or an apparatus or an equipment, or a device.

FIG. 4b is the rectangular ME housing MCA, and INSIDE-ME filled with Vacuum (VAC) or Dust Free Air (DFA), and each of whose dimensions increase and decrease for increased or decreased size of a MCA, or an apparatus or an equipment, or a device.

FIG. 4c is the cylindrical ME housing MCA, and INSIDE-ME filled with Vacuum (VAC) or Dust Free Air (DFA), and whose height is equal to its diameter, and diameter increase and decrease for increased or decreased size of a MCA, or an apparatus or an equipment, or a device.

FIG. 4d is the cylindrical ME housing MCA, and INSIDE-ME filled with vacuum (VAC) or Dust Free Air (DFA), and each of whose dimensions increase and decrease for increased or decreased size of a MCA, or an apparatus or an equipment, or a device.

FIG. 6a is the schematic block diagram of IC chips 10a mounted on typical PCB 100a.

FIG. 9 is a cross-sectional diagram of any one flat side of a ME housing MCA depicting inside rough surface and coating of material that absorbs impinging Electromagnetic Waves (EMW) and converts them to heat, and FIG. 10 depicts the cross section of one flat side of the ME housing MCA along with INSIDE-ME depicting inside rough surface and coating of material that absorbs impinging Electromagnetic Waves (EMW) and converts them to heat of an apparatus or an equipment or a device.

FIG. 11 depicts memory bit read/write head operation.

FIG. 12 depicts SMO and SO memory organization as rows and columns.

FIG. 13 depicts typical 16 megabit SMO or SO NVRAM (4M×4).

FIG. 14 depicts typical 16 megabit SMO or SO NVRAM package pins and signals.

FIG. 15 depicts a typical grid of Magneto-Optical (MO) or Optical (0) bit readers/writers.

DESCRIPTION OF PREFERRED EMBODIMENT

Figure 3A:
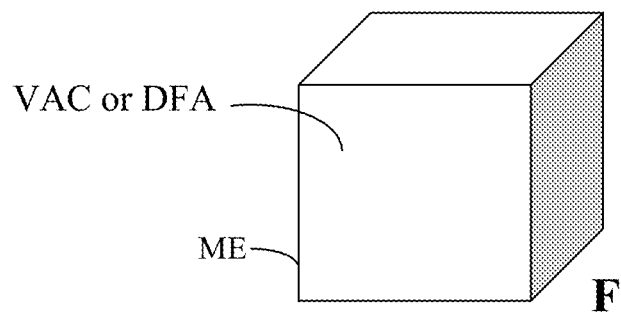
FIG. 3a is the cubical ME filled with Vacuum (VAC) or Dust Free Air (DFA) and housing MCA of the same dimensions on all sides, and dimensions increase and decrease for increased or decreased size of the parallel MCA, or an apparatus or an equipment, or a device.
Figure 3B:
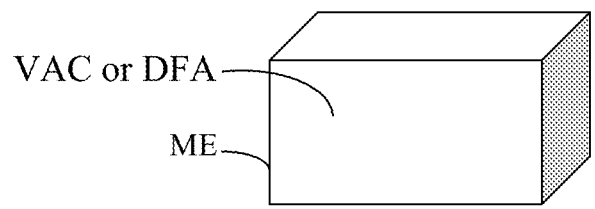
FIG. 3b is the rectangular ME filled with Vacuum (VAC) or Dust Free Air (DFA) and housing MCA whose dimensions increase and decrease for increased or decreased size of the parallel MCA, or an apparatus or an equipment, or a device.
Figure 3C:
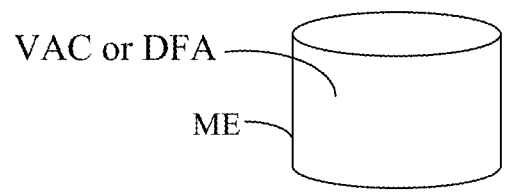
FIG. 3c is the cylindrical ME filled with Vacuum (VAC) or Dust Free Air (DFA) and housing MCA whose height is equal to its diameter, and diameter increase and decrease for increased or decreased size of the parallel MCA, or an apparatus or an equipment, or a device.
Figure 3D:
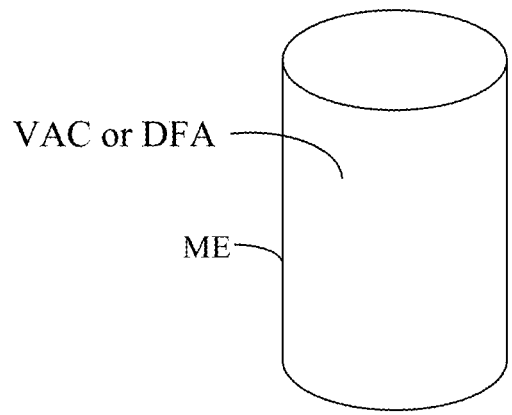
FIG. 3d is the cylindrical ME filled with Vacuum (VAC) or Dust Free Air (DFA) and housing MCA whose dimensions increase and decrease for increased or decreased size of the parallel MCA, or an apparatus or an equipment, or a device.

Present invention is about putting MCA or any other similar apparatus/equipment/device into an electro-magnetically shielded and sealed Metallic Enclosure (ME) or Container, and using wireless means for communication among its components mounted/fabricated/integrated/embedded with TRAs. The Wireless Interconnect (WLI) constitutes enclosed free space within an electromagnetically shielded and sealed ME and/or INSIDE-ME and TRAs mounted/fabricated/integrated/embedded one on each of the components of MCA. WLI provides a means of wireless communication among components of MCA. Aluminium, Copper, CNT, GNR or any pure or alloy metal that is good conductor of both heat and electricity can be used in making ME and INSIDE-ME. The ME also acts as heat sink for component ICs of the MCA, or an apparatus or an equipment, or a device, and if required it can be corrugated and/or finned on the outside to increase surface area for heat dissipation. The ME of MCA, or an apparatus or an equipment, or a device, is also made dust proof, sound proof, and water proof so that it can be submerged underwater (under water) in a tank or a sea or a lake or a river preferably closer to the mouth of river where water is clean, pristine and naturally flowing in order to save electricity expended in cooling MCA particularly when it constitutes a data centre or a cloud computing centre. As per statements in US patent application publication # US 2012/0331269 titled "Geodesic Massively Parallel Computer": High-performance computer systems consume large amounts of electrical power, some of which gets dissipated as heat. Typically, a similar amount of energy is used by refrigeration as the computer proper. That means, by putting MCAs constituting data/cloud centres under water in a tank or a sea or a lake or a river particularly close to the mouth of a river can save almost 50% of electrical power used in running data/cloud centre, and eliminates the need for air conditioning and refrigeration for cooling. Water proofed ME housing MCA with all possible interconnects including WLI, any conventional wired interconnect, or even Optical Interconnect can be submerged underwater in a tank or a sea or a lake or a river for cooling eliminating the need for air conditioning and refrigeration.

ME being electromagnetically shielded and sealed whole range of radio, microwave, and optical frequencies are available for wireless means of communication among components of a MCA or an apparatus or an equipment or a device enclosed. The whole range of frequencies involves the range from lows of 10s HZs to highs of GHZs and beyond. A designer can use different range of frequencies for different purposes of communication, or different frequency ranges for different purposes of communication inside electromagnetically sealed ME for different products can be standardized by industry associations. Inside of ME housing MCA and INSIDE-ME is either vacuum or filled with clear/clean purified Dust Free Air (DFA) without any suspended particles for more efficient and reliable wireless communication. For mitigation of the problem of reflections and multiple paths, inside surfaces of ME housing MCA and INSIDE-ME are made rough enough to cause much of scattering and less of reflection of impinging electromagnetic waves (EMWs). Also, all surfaces of PCBs and components mounted on them are made themselves rough enough or covered with rough enough surfaces to mitigate the problem of reflection and multiple path. Rough surfaces can be created by alternative ways as per alternative definitions of the phrase 'Rough Surface' provided before under the heading of 'SOME DEFINITIONS'. Also, to mitigate the problem of reflection and multiple path, all inside surfaces of electromagnetically shielded and sealed ME housing MCA and INSIDE-ME schematically shown in FIG. 2a, FIG. 2b, FIG. 2c, and FIG. 2d are coated with coating material capable of absorbing impinging electromagnetic waves/signals and convert them into heat that can be conducted away to ME housing MCA that also acts as heat sink. These measures are taken in addition to setting multiple path equalization value on transmitters to effectively cancel the reflections and multiple paths. Transmitter equalization significantly reduces Inter Symbol Interference (ISI) caused by dense multiple path signals.

FIG. 1a is the prior art BPPCA FIG. 4 of U.S. Pat. No. 7,788,051 and Canadian patent no. 2564625, FIG. 1b is the prior art BPPCA of FIG. 1a with shared memory divided into multiple SMUs, and FIG. 1c is the prior art BPPCA of FIG. 1a with shared memory divided into multiple SMUs, but in another possible arrangement of SMUs. Specifically, the components of MCA are n-PUs, m-SMUs, and k-I/Os, where numbers n, m, and k could be the same, different, any two of them the same and the third different or in any possible combination depending on a particular MCA. FIG. 1c is the special case where n=m. The prior art fixed interconnect topologies such as star, tree, ring, mesh, tours, hypercube, spherical hypercube and any variants of them or interconnect controlled by routing network are schematically shown to be contained in a box to which processors, SMUs and I/Os are connected with bidirectional links as per FIG. 1b and FIG. 1c.

Invented WLIs involving TRAs of FIG. 2a and FIG. 2b, and FIG. 2c and FIG. 2d corresponds to prior art interconnects of FIG. 1b and FIG. 1c respectively. FIG. 2a and FIG. 2b contain two metallic enclosures (MEs). The ME housing MCA houses PUs, SMUs, interface circuits of I/Os, and INSIDE-ME. The INSIDE-ME provides electromagnetically shielded and sealed confined free space as a means for realization of wireless interconnect for communication among components of MCA such as PUs, SMUs and interface circuits of I/Os. The ME housing MCA can be conventional with cooling fans with heat sinks mounted on PUs and other heat producing circuits. The ME housing MCA can also act as extended heat sink for PUs and other heat producing circuits when they are directly connected from inside to the ME housing MCA not requiring any noise producing cooling fan and associated individual heat sink. The ME housing MCA can also be electromagnetically shielded and sealed in case communication inter/among sub-functional components (units) of a function is designed and made wireless. For example, sub-functional components (units) of a functional component CPU are Arithmetic-Logical-Unit (ALU), Control Unit and Registers as per FIG. 8a and FIG. 8b. Electromagnetically shielded and sealed both ME housing MCA and INSIDE-ME can help separate local wireless communications inter/among sub-functional components (units) and global wireless communications inter/among functional components (units) such as PUs, SMUs and interface circuits of I/Os. FIG. 2c and FIG. 2d contain only one ME housing MCA that houses processors (PUs), SMUs, and interface circuits of I/Os, and also provides electromagnetically shielded and sealed confined free space as a means for realization of wireless interconnect for communication among functional components of MCA and their sub-functional components. The best possible embodiment desired is to have ME housing MCA provide electromagnetically shielded and sealed confined free space for realization of WLI involving TRA, act as extended heat sink for housed components directly attached to it, made dust-proof, waterproof, and soundproof. Electromagnetically shielded and sealed confined free space enclosed within the ME housing MCA and/or INSIDE-ME is needed to be vacuumed or filled with purified/cleaned/cleared Dust Free Air (DFA) without any suspended particles for efficient and reliable wireless communications, and MEs are needed to be dust proofed. For saving electricity used in cooling ME housing MCA acting as a heat sink, it needs to be water-proofed so that ME housing MCA can be submerged under-water in a tank or a sea, or a lake, or a river preferably closer to the mouth of the river where water is cleaner, pristine and naturally flowing.

FIG. 3a, FIG. 3b, FIG. 3c, and FIG. 3d are different possible shapes of ME housing MCA in FIG. 2c, and FIG. 2d. The ME housing MCA could also be spherical in shape. However, the preferred shapes could be cubical of FIG. 3a or cylindrical of FIG. 3c or spherical in order to keep all WLI involving TRA or wireless communication distances similar or approximately equal.

FIG. 4a, FIG. 4b, FIG. 4c, and FIG. 4d are different possible shapes of INSIDE-ME and ME hosing MCA in FIG. 2a, FIG. 2b. The INSIDE-MEs and ME housing MCAs could also be spherical in shape. However, the preferred shapes could be cubical of FIG. 4a or cylindrical of FIG. 4c or spherical in order to keep all WLI involving TRA or wireless communication distances similar or approximately equal.

The present invention provides apparatus for massively parallel MCA implementation where best and worst-case neighbour-to-neighbour distances can be short and similar, which facilitates transmission, reception and broadcast of information/data with high performance and substantially equal timing. In every sense, the invention is as general purpose as other parallel computers and is eminently scalable in terms of size, configuration, and performance. It lands itself well to a broad variety of apparatus or equipment or device that can be enclosed in electromagnetically shielded and sealed ME and use wireless interconnect for communication among/inter and/or within/intra functional or sub-functional component ICs and other functional or sub-functional component circuits.

Cubical, spherical and cylindrical with height equal to diameter MEs allow maximum distance travelled by wireless communication signals of data, instruction, control to be approximately the same. However, MEs can be made of any shape that permits fastest possible communications particularly between PUs and SMUs for high-bandwidth data rates communications. Other slower low-bandwidth data rate communications such as control signals can take place over longer distances. For example, processors (PUs) PCBs and SMUs PCBs can be mounted on central portion of longer 4-metallic sides of rectangular ME, and control and other circuit PCBs can be mounted on top and bottom 2-metallic sides and end portions of longer 4-sides of rectangular ME, and there are many such other possibilities. Because of high-bandwidth data rates communications requirements between processors (PUs) and SMUs only different possible processors (PUs) and SMUs layouts are given in FIGS. 5 to 7. However, a designer can appropriately place ICs for functions of other purposes among processors (PUs) and SMUs layouts or they can be placed on separate inside surface of ME.

Various possible arrangements or layouts of components within ICs, ICs on PCBs and PCBs on metallic surfaces of ME will now be described using various figures. Since communications among processors (PUs) and SMUs are the major factor in the performance of MCAs, various possible layouts only of processors and an SMUs are shown in Figures described in the following.

Figure 5A:
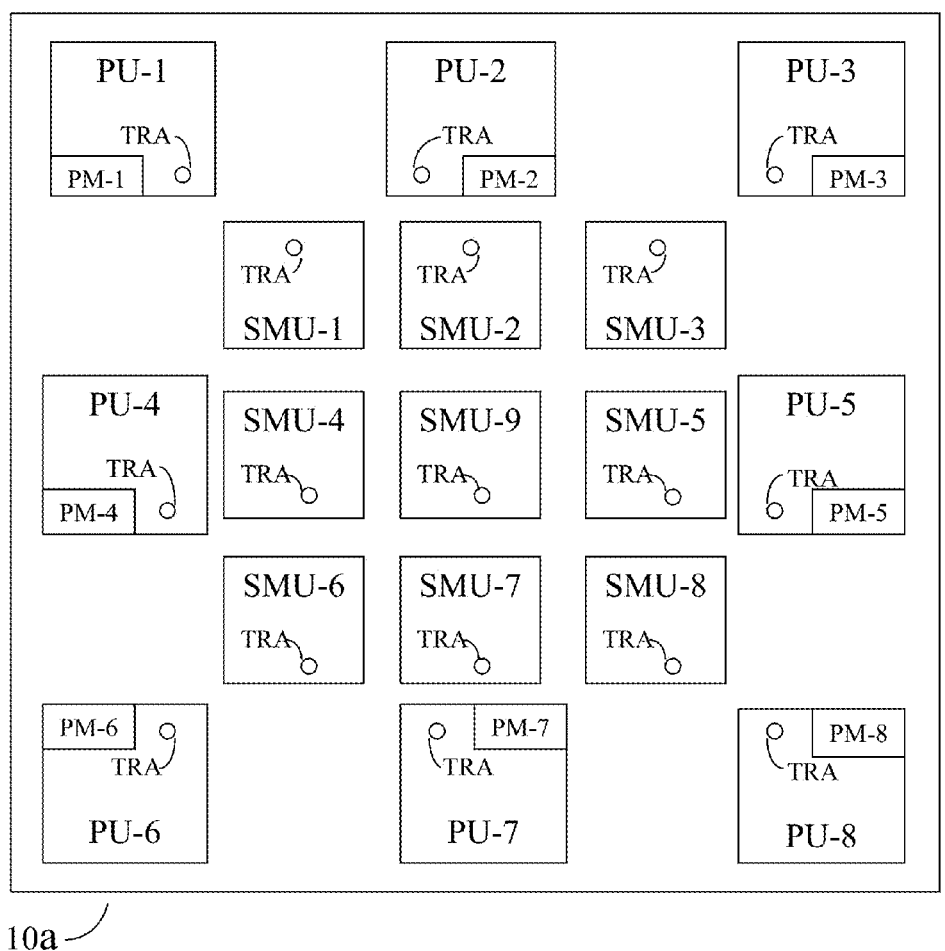
FIG. 5a is the schematic block diagram of a typical Integrated Circuit (IC) 10a chip that contains and symbolically shows PUs and SMUs along with embedded transceiver-antenna (TRA) for each.
Figure 5B:
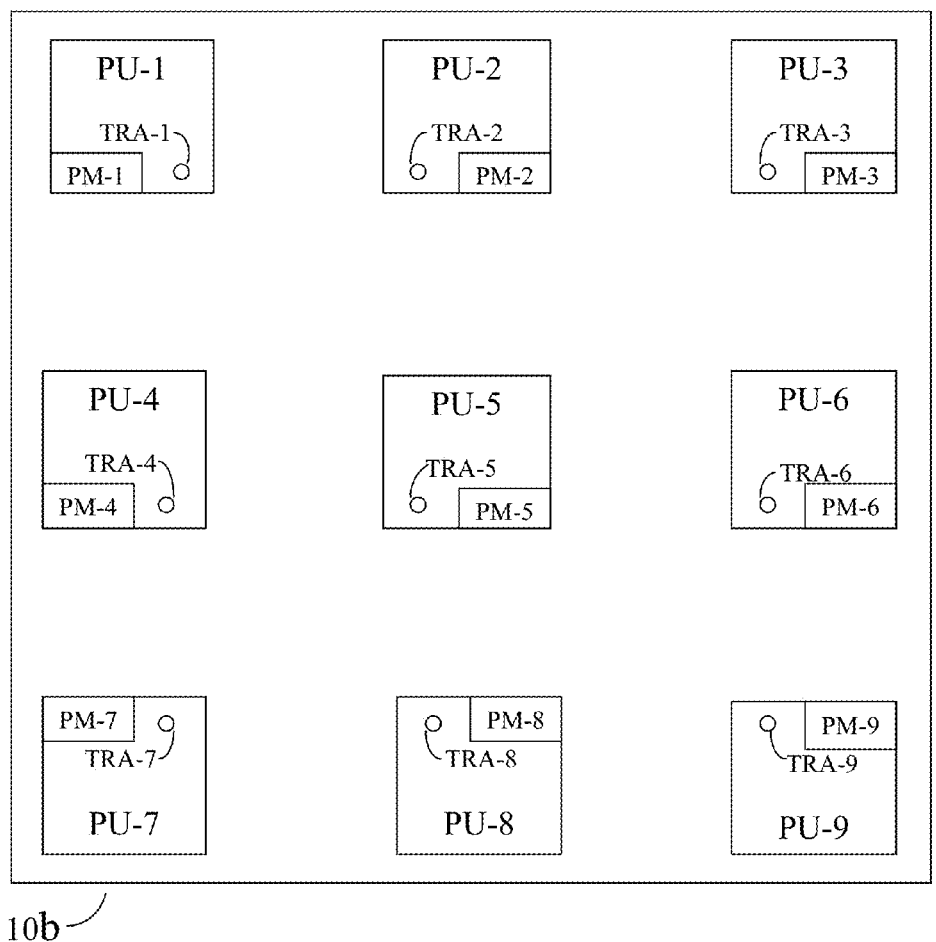
FIG. 5b is the schematic block diagram of a typical IC 10b chip that contains only PUs along with embedded transceiver-antenna (TRA) for each.
Figure 5C:
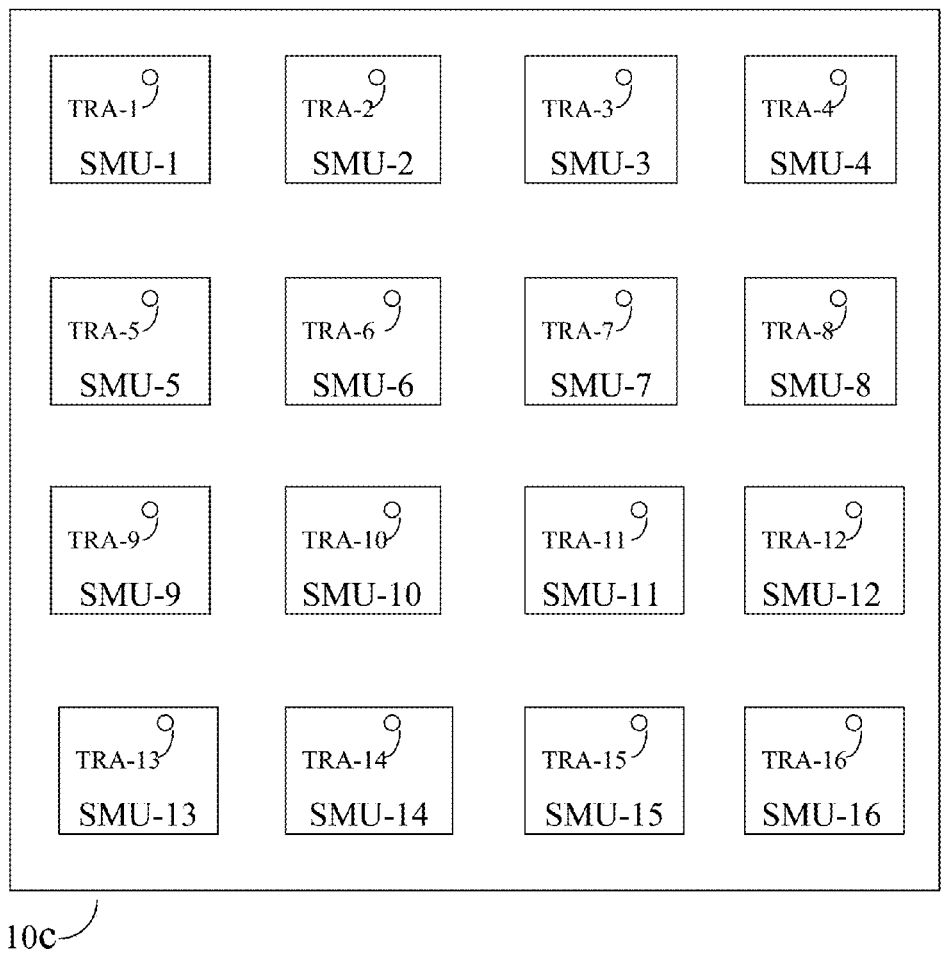
FIG. 5c is the schematic block diagram of a typical memory IC 10c chip that contains only SMUs along with embedded transceiver-antenna (TRA) for each.
Figure 6A:
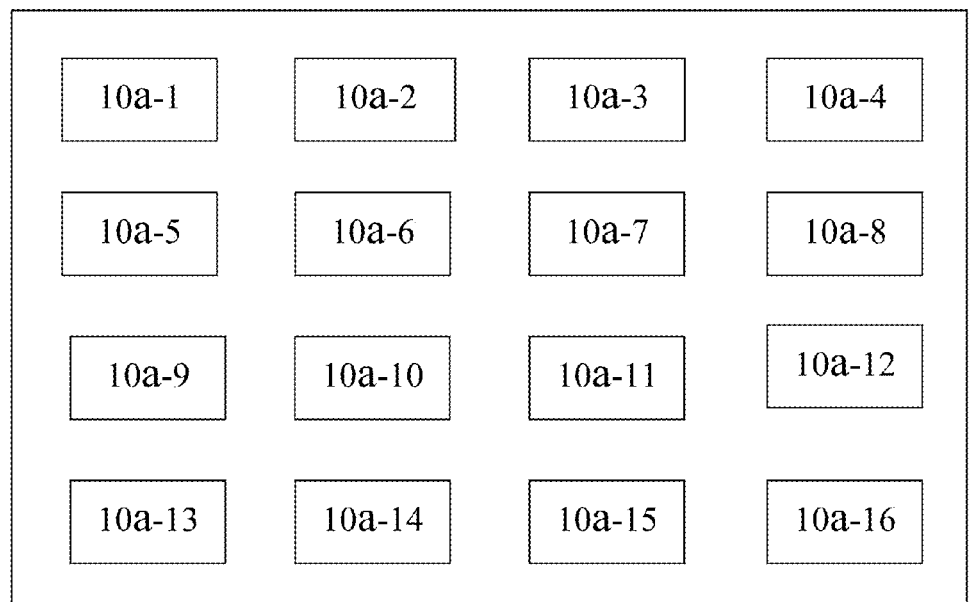
Figure 6B:
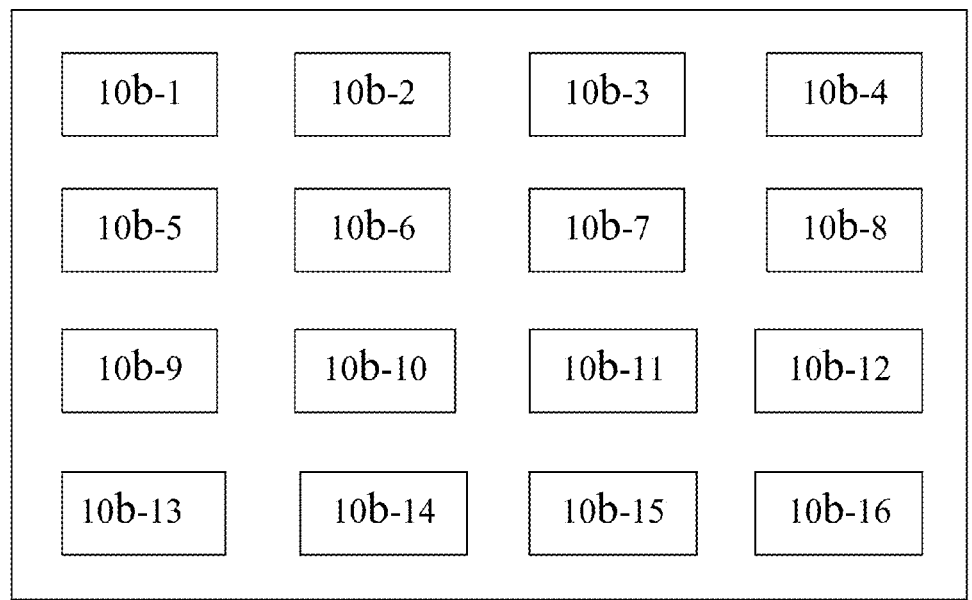
FIG. 6b is the schematic block diagram of IC chips 10b mounted on typical PCB 100b.
Figure 6C:
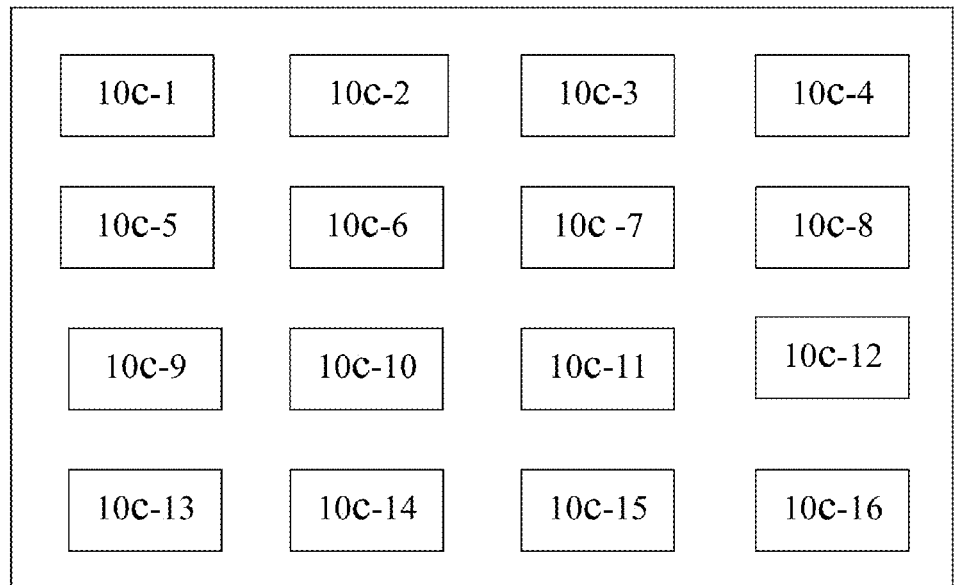
FIG. 6c is the schematic block diagram of IC chips 10c mounted on typical PCB 100c.
Figure 6D:
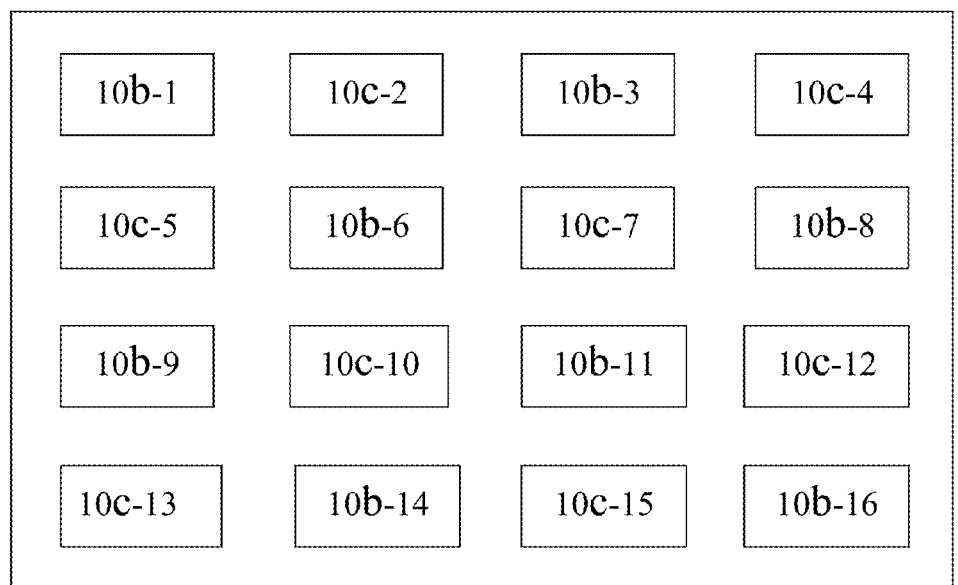
FIG. 6d is the schematic block diagram of IC chips 10b and 10c mounted on typical PCB 100d.
Figure 6E:
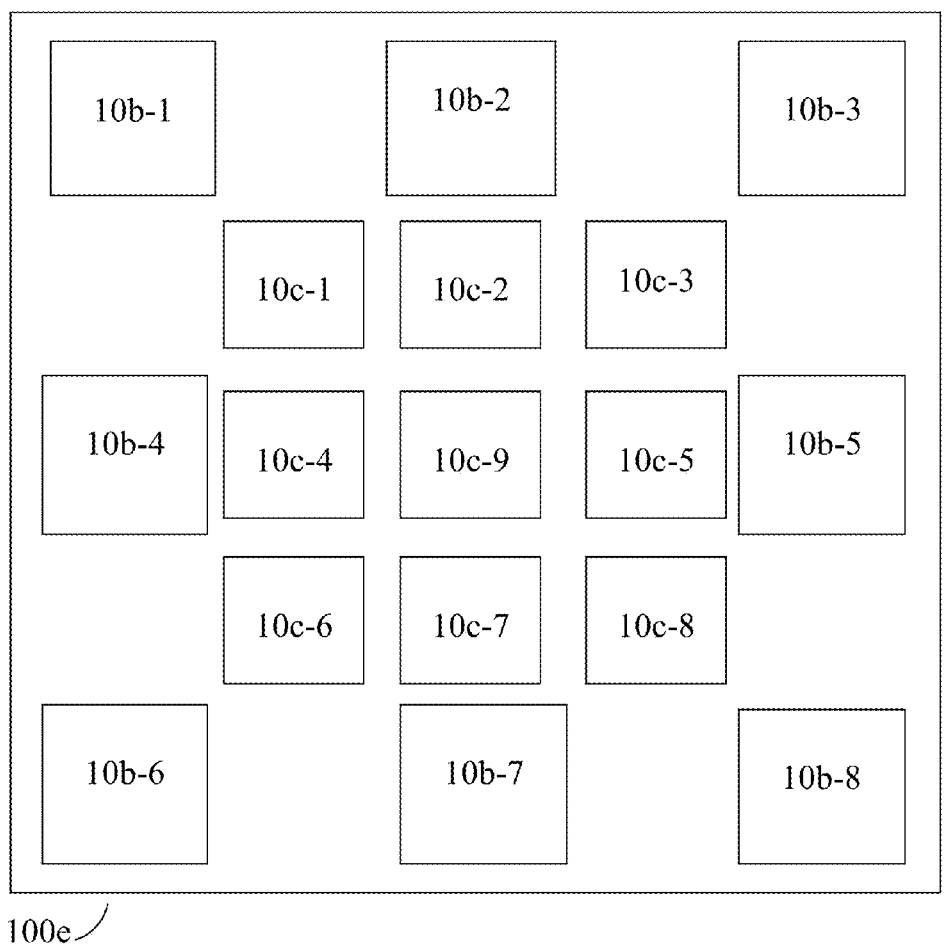
FIG. 6e is the schematic block diagram of IC chips 10b and 10c mounted on typical PCB 100e.
Figure 7A:
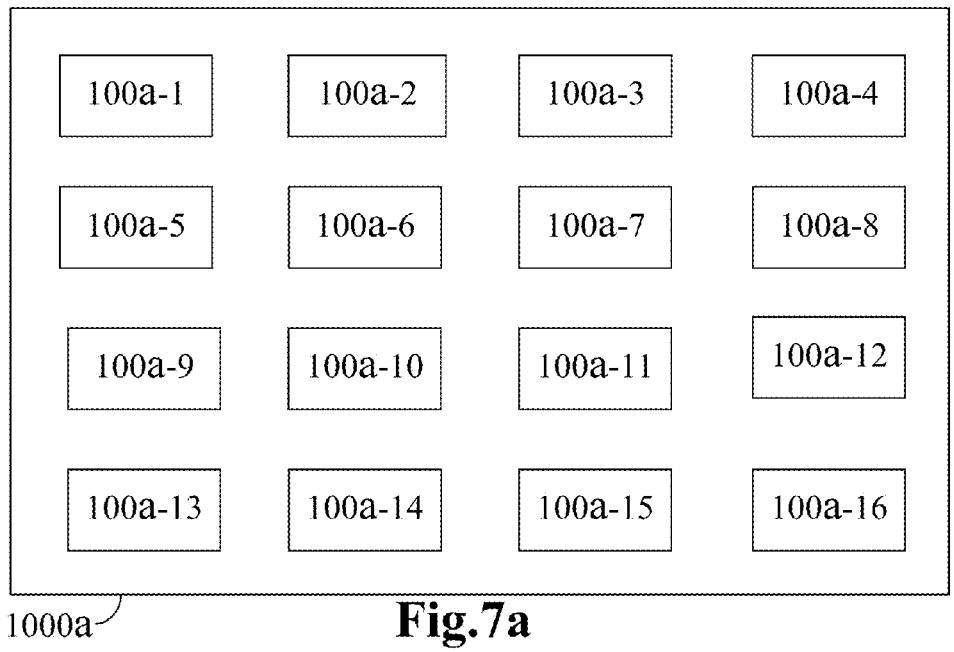
FIG. 7a is the schematic layout of PCBs 100a mounted on metallic surface 1000a that acts as heat sink and forms one side of Metallic Enclosure (ME) that houses MCA, or an apparatus or an equipment, or a device.
Figure 7B:
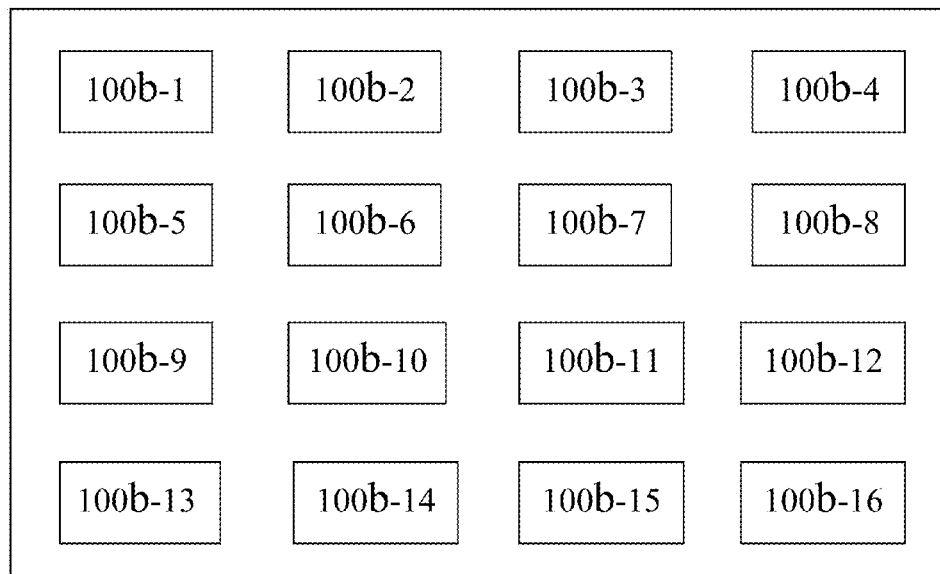
FIG. 7b is the schematic layout of PCBs 100b mounted on metallic surface 1000b that acts as heat sink and forms one side of ME that houses MCA, or an apparatus or an equipment, or a device.
Figure 7C:
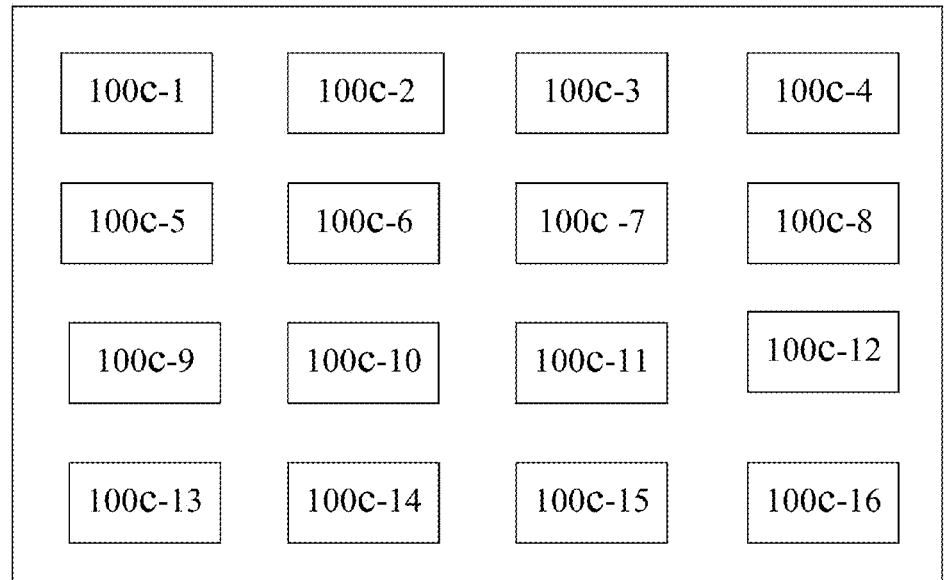
FIG. 7c is the schematic layout of PCBs 100c mounted on metallic surface 1000c that acts as heat sink and forms one side of ME that houses MCA, or an apparatus or an equipment, or a device.
Figure 7D:
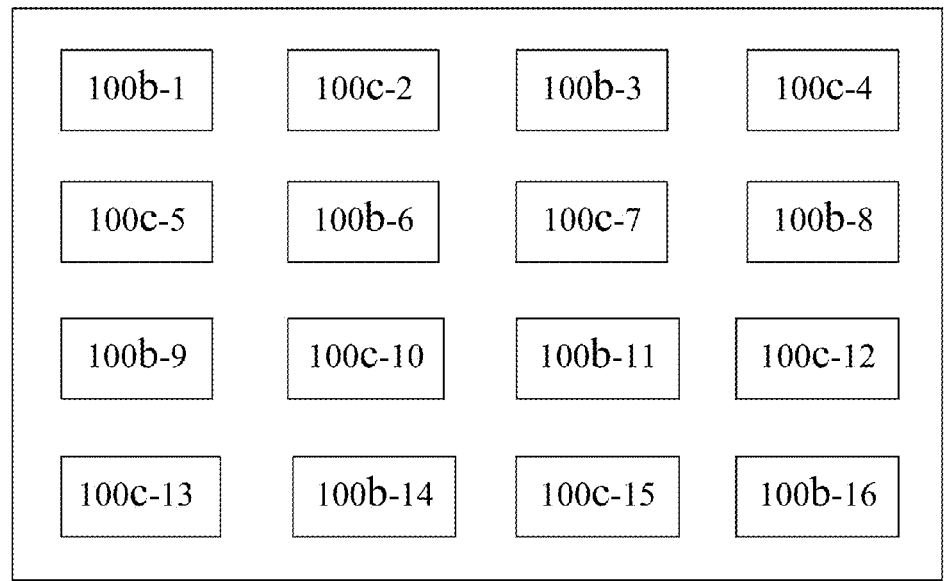
FIG. 7d is the schematic layout of PCBs 100b and 100c mounted alternately on metallic surface 1000d that acts as heat sink and forms one side of ME that houses MCA, or an apparatus or an equipment, or a device.
Figure 7E:
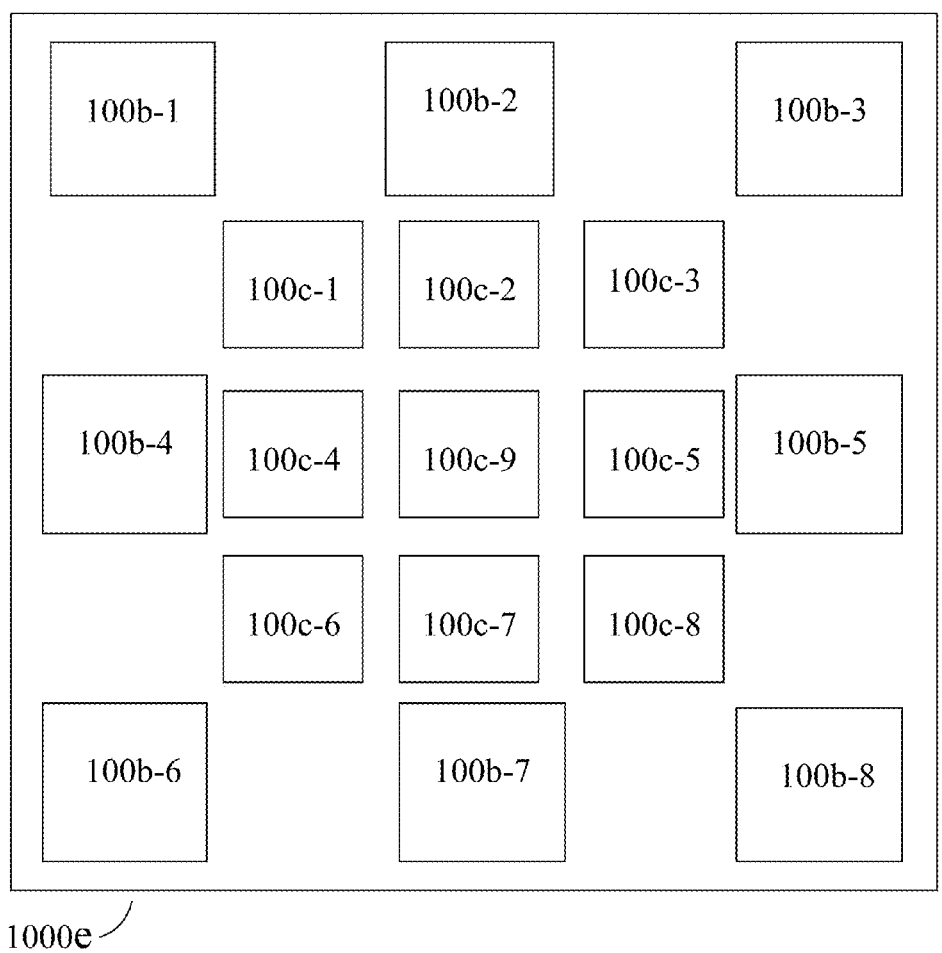
FIG. 7e is the schematic layout of PCBs 100b and 100c mounted on metallic surface 1000e that acts as heat sink and forms one side of ME that houses MCA, or an apparatus or an equipment, or a device.

FIG. 1*a* is the best possible parallel computer architecture originally claimed in U.S. Pat. No. 7,788,051 that marked beginning of the new era of computer technology. The same architecture is depicted into FIG. 5*a* without any connecting lines shown because of WLI and without depicting Input/Output unit. In FIG. 5*a* IC chip 10*a* contains say 8 processors also called Processing Units (PUs) PU-1, PU-2, . . . , PU-8 each having its local private memory (PM) PM-1, PM-2, . . . , PM-8 and embedded transceiver-antennas (TRAs) for sending/receiving information/data to/from among themselves and other components of MCA. SMU-1, SMU-2, . . . , SMU-9 are shared memory units among all processors PU-1, PU-2, . . . , PU-8. TRAs are mounted/fabricated/integrated/embedded transceiver-antennas (TRAs) one on each of PUs, SMUs, and I/Os. FIG. 5*b* is of IC chip 10*b* containing say 9 only processors PU-1, PU-2, . . . , PU-9 along with their private memories PM-1, PM-2, . . . , PM-9 and mounted/fabricated/integrated/embedded transceiver-antennas TRAs. FIG. 5*c* of IC chip 10*c* containing say 16 only shared memory units SMU-1, SMU-2, . . . , SMU-16 along with their mounted/fabricated/integrated/embedded transceiver-antennas TRAs. Number of processors (PUs) and/or number of shares memory units (SMUs) in each IC chip varies depending on level of integration or the size of IC. FIG. 6*a* is the schematic diagram of PCB 100*a* on which mounted are the IC chips 10*a*-1, 10*a*-2, . . . , 10*a*-16. FIG. 6*b* is the schematic diagram of PCB 100*b* on which mounted are the IC chips 10*b*-1, 10*b*-2, . . . , 10*b*-16. FIG. 6*c* is the schematic diagram of PCB 100*c* on which mounted are the IC chips 10*c*-1, 10*c*-2, . . . , 10*c*-16. FIG. 6*d* is the schematic diagram of PCB 100*d* on which mounted are the IC chips 10*b*-1, 10*c*-2, 10*b*-3, 10*c*-4, . . . , 10*c*-16. FIG. 6*e* is the schematic diagram of PCB 100*e* on which mounted are the IC chips 10*b*-1, 10*b*-2, . . . , 10*b*-8 and the IC chips 10*c*-1, 10*c*-2, . . . , 10*c*-9. PCBs, in addition to mounted ICs, may also contain other discrete components as required. The only printed circuits are those for supplying power to different IC chips and interconnects for discrete components mounted on PCB. Sometimes lines carrying control signals are also printed on circuit boards on which ICs are mounted, and transceiver-antennas TRAs are used only for wireless transmittal of data signals. FIG. 7*a*, FIG. 7*b*, FIG. 7*c*, FIG. 7*d*, and FIG. 7*e* are the schematic layouts of PCBs 100*a*-1, 100*a*-2, . . . , 100*a*-16; 100*b*-1, 100*b*-2, . . . , 100*b*-16; 100*c*-1, 100*c*-2, . . . , 100*c*-16; 100*b*-1, 100*c*-2, 100*b*-3, 100*c*-4, . . . , 100*c*-16; and 100*b*-1, 100*b*-2, . . . , 100*b*-8 and 100*c*-1, 100*c*-2, . . . , 100*c*-9; mounted respectively on metallic surfaces 1000*a*, 1000*b*, 1000*c*, 1000*d*, and 1000*e* that acts as heat sink and forms one side of enclosure of ME or portion of curved surfaces of cylindrical or spherical ME that houses MCA. FIGS. 5 to 7 are for depicting different possible layouts of different functional blocks/units inside each of ICs, different ICs mounted on PCBs, and different PCBs mounted on inside of ME sides.

Single IC chip can contain say, 5, 10, 100, . . . etc processors along with local private memory of each processor depending on SSI, LSI, or VLSI chip, and depending on size of MCA that is being built. MCA of few processors say, 10 could be housed in small ME, and massively parallel MCA of 1000s and 1000s of processors requires huge cubical, spherical, cylindrical, or rectangular ME. The length of all sides of cubical ME is the same as in FIG. 3*a* and FIG. 4*a*, and height of cylindrical ME is the same as its diameter as in FIG. 3*c* and FIG. 4*c*. However, MEs of other shapes can also be used such as rectangular as in FIG. 3*b* and FIG. 4*b*, cylindrical as in FIGS. 3*d* and 4*d*, and spherical. Between a processor (PU) and its local PM are wired connections, however, they can also be connected by intra-chip WLIs involving TRAs. Communication among processors (PUs) and shared resources is wireless through mounted/fabricated/integrated/embedded transceiver-antenna (TRA) one on each of processors (PUs), each of SMUs, and each of other shared resources like I/Os. SMU is made up of a group of addressable memory locations or Random Access Memory (RAM) Locations. Usual wired connections are provided among the group of addressable RAM locations contained in each SMU, however, they can be intra-chip WLIs involving TRAs. Ideally, the smallest SMU is made up of a single addressable memory location. Similarly all shared input/output devices are also mounted/fabricated/integrated/embedded with transceiver-antennas TRAs for wireless communication with other components of MCA. SMUs can be on the same IC chip of multiprocessors or it can be a separate IC chip in itself. IC chips can be arranged on PCB in different possible arrangements depicted in FIG. 6*a*, FIG. 6*b*, FIG. 6*c*, FIG. 6*d*, and FIG. 6*e*. Other IC chips for inputs/outputs and IC chips of transceiver-antennas TRAs that facilitate wireless communications are added on PCBs as required. A transceiver along with its antenna (TRA) can also be mounted/fabricated/integrated/embedded with each IC chip of processors (PUs), SMUs and interface circuit ICs of peripheral components of I/Os. The only wired or printed copper traces connections required on PCBs are for supplying Electrical Power to various IC chips, and wiring traces for other discrete electronic components as required. A transceiver along with its antenna (TRA) can also be mounted/fabricated/integrated/embedded with each IC chip of multiprocessors (PUs), SMUs, and interface circuit ICs of peripheral components like I/Os. PCB without many wired connections can accommodate many multiprocessor (PUs) IC chips and SMU IC chips. This helps achieve miniaturization of MCA.

Figure 8A:
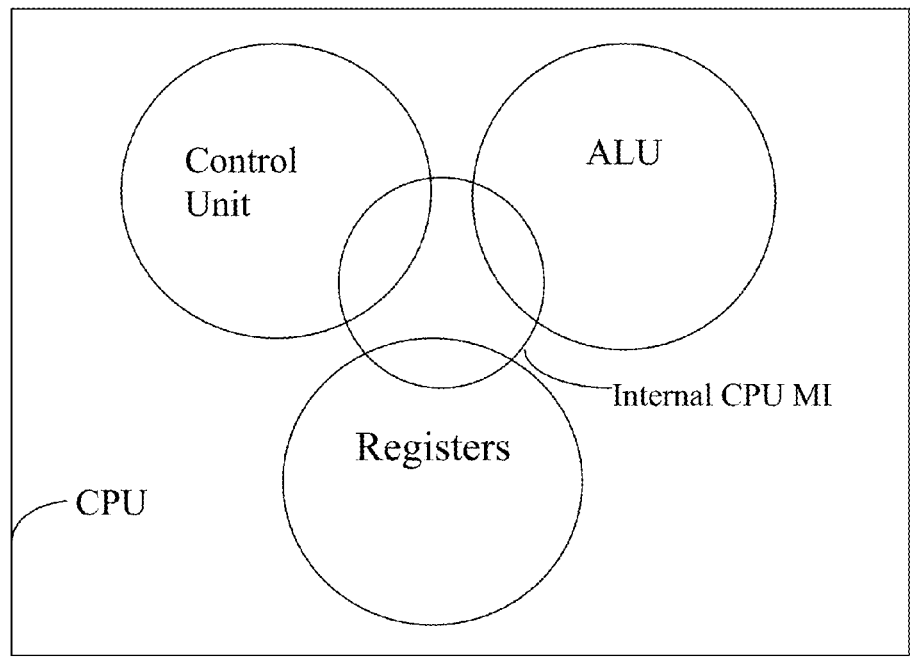
FIG. 8a and FIG. 8b are the schematic block diagrams of sub-functional units within a functional unit of Central Processing Unit (CPU) with MI and WLI involving TRAs respectively for communication among/inter sub-functional units.
Figure 8B:
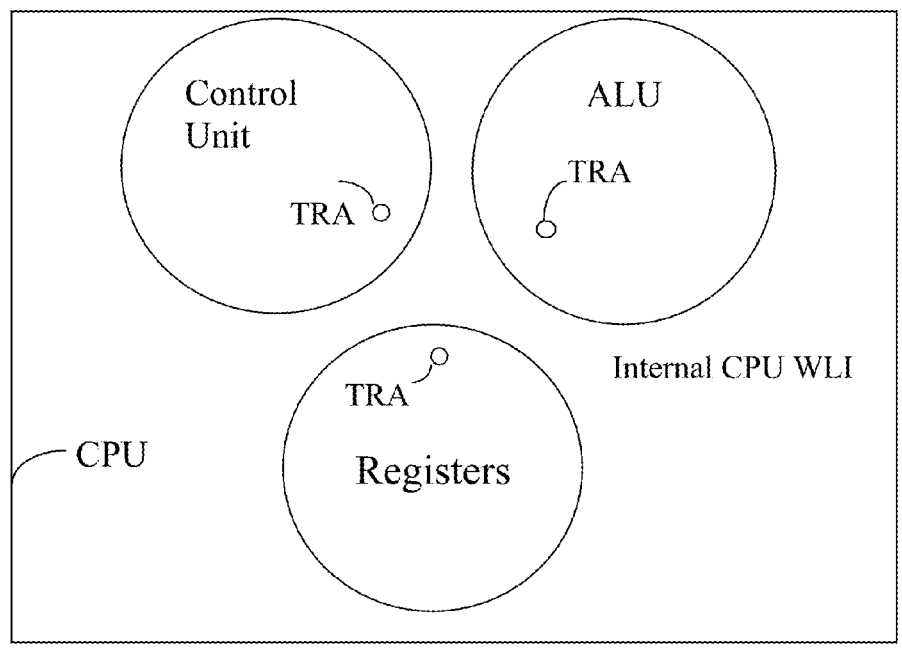

FIG. 8*a* depicts sub-functional blocks/units of Control Unit, Arithmetical Logical Unit (ALU), and Registers of a CPU or PU with internal CPU Metallic Interconnect (MI) for communication among/inter sub-functional units. However, this MI for communication among/inter sub-functional blocks/units can be replaced by WLI comprising TRAs and electromagnetically shielded and sealed confined free space within ME housing MCA as shown in FIG. 8*b*. Similarly, any of the functional components/units of a MCA or an equipment or a device can be divided into sub-functional blocks/units and WLI can be provided for communication among/inter sub-functional blocks/units in addition to WLI for communication among/inter functional components of a MCA or an equipment or a device. FIG. 9 depicts the cross section of one side of the ME housing MCA or an equipment or a device with inside surface made rough to cause much of the scattering and less of reflection of impinging electromagnetic waves and thinly coated with material that can absorb impinging electromagnetic waves (EMW) and convert into heat. The coating is so thin that original roughness of the inside surface of the sides of ME is retained. In FIG. 9, though the thin coating is schematically shown/appears thicker, the surface remains rough, as schematically shown, even after application of thin coating. Similar to FIG. 9, FIG. 10 depicts the cross section of one side of the ME housing MCA along with INSIDE-ME.

This invention is about making available the whole range of radio, microwave, and optical frequencies from lows of 10s HZs to highs of GHZs and beyond for wireless preferably Line-of-sight (LOS) one to all and all-to-all communication among components of MCA or an apparatus or an equipment or a device by enclosing it in an electromagnetically shielded and sealed ME that also acts as heat-sink for heat producing components like microprocessors. In other words, an apparatus or an equipment or a device enclosed in a dust-proofed and electromagnetically shielded and sealed ME making available the whole range of radio, microwave, and optical frequencies for wireless direct one to all and all-to-all communication among its components, and ME also acts as an extended heat-sink for heat producing components attached to it from inside, wherein ME is either vacuumed or filled with clean air without any suspended particles for efficient and reliable communication.

In another embodiment of this invention, an apparatus can be built that can eliminate routing apparatus/system that requires time delaying and power consuming buffering and switching operations in packet switched or circuit switched communication systems. Such an apparatus when replaces each of the routing apparatus/system in a communication system, information/data can flow without any hindrances to destinations. Hasn't this inventor become a great artist now that he is able to sing: let it flow, let it flow, let it flow . . . ?

This description of preferred embodiment of Static Magneto Optical (SMO) or Static Optical (SO) Non-Volatile Random Access Memory (NVRAM) and relevant figures are adapted from the description of Semiconductor Main Memory on pages 111-114 from the book titled "Computer Organization and Architecture" Fourth Edition by William Stallings published by Prentice Hall Inc. in the year 1996. Generally, invented NVRAM can be made up of any media that can be written to and read from optically without requiring any rotational or linear motion.

The basic element of a NVRAM is the optical read/write head placed on NVRAM media. Like semiconductor memory cell, a bit read/write head placed on a NVRAM (SMO or SO) media share common properties:

NVRAM (SMO or SO) media can be recorded with two stable states, which can be used to represent binary 1 and 0.

They are capable of being written into to set the state.

They are capable of being read from to sense the state.

FIG. 11 depicts the operation of a bit read/write head. The read/write head has three functional terminals capable of carrying an electrical signal. The select terminal selects a bit read/write head for a read or write operation. The control terminal indicates read or write operation. For writing, the other terminal provides an electro-magnetic or electro-optical or optical signal that sets the state 1 or 0 of the NVRAM (SMO or SO) media under the selected bit read/write head. For reading, that same terminal is used for output of NVRAM (SMO or SO) media state under the selected bit read/write head. For the purpose of this application, it will be taken as given that an individual bit read/write head or a group read/write heads can be selected for a reading or writing operation.

Chip Logic

As with semiconductor memory Integrated Circuit (IC), a group of bit read/write heads placed over NVRAM (SMO or SO) media can be a packaged chip. Each chip contains an array of bit read/write heads placed over NVRAM (SMO or SO) recordable, erasable, re-recordable media. FIG. 12 depicts recording on NVRAM (SMO or SO) media in square/rectangular form factor.

FIG. 13 shows a typical organization of 16 mega bit NVRAM (SMO or SO chip. In this case, 4-bits are read or written at a time. Logically, the memory array is organized as four square arrays of 2048 by 2048 elements as partially depicted in FIG. 12. Various physical arrangements are possible. In this case, the elements of the array are connected by both horizontal (row) and vertical (column) lines. A horizontal line connects to a select terminal of a bit read/write head in its row; a vertical line connects to the data-in/sense (data-out) terminal of each bit read/write head in its column.

Address lines provide the address of the word (W-group of bits) to be selected. A total of log 2 W lines are needed. In our example, 11 address lines are needed to select one of 2048 rows. These 11 lines are fed into row decoder, which has 11 lines of input and 2048 lines of output. The logic of the decoder activates a signal one of the 2048 outputs depending on the bit pattern on the 11 input lines ($2^{11}$=2048).

An additional 11 address lines select one of 2048 columns of four bits per column. Four data lines are used for the input and output of four bits to and from a data buffer. On input (write), the bit driver of each bit line is activated for a 1 or 0 according to the value of the corresponding data line. On output (read), the value of each bit line is passed through a sense amplifier and presented to the data lines. The row lines select which cells (bit read/write head) is used for reading or writing.

Since, only four bits are read/written to this NVRAM (SMO or SO) at a time, there must be multiple NVRAM (SMO or SO) connected to the memory controller in order to read/write a word of data to the bus.

Note that there are only 11 address lines (A0-A10), half the number you would expect for a 2048×2048 array. This is done to save on number of pins. The 22 required address lines are passed through select logic external to the chip and multiplexed onto the 11 address lines. First, 11 address signals are passed to the chip to define the row address of the array, and then the other 11 address signals are presented for the column address. These signals are accompanied by Row Address Select (RAS) and Column Address Select (CAS) signals to provide timing to the chip.

Multiplexed addressing plus the use of square arrays result in a quadrupling of memory size with each new generation of memory chips. One more pin devoted to addressing doubles the number of rows and columns, and so the size of memory grows by a factor of 4. Note that FIG. 13 does not include refresh circuitry required for semiconductor DRAM (Dynamic RAM) for refresh operation.

Chip Packaging

A typical NVRAM (SMO or SO) chip pin configuration is shown in FIG. 14 for a 16-megabit chip organized as 4M×4. Since a RAM can be updated, the data pins are inputs/outputs. The write enable (WE) and output enable (OE) pins indicate whether this is a write or read operation. Because, RAM is accessed by row and column, and the address is multiplexed, only 11 address pins are needed to specify the 4M rows/columns combinations ($2^{11} \times 2^{11} = 2^{22}$=4M). The function of the row address select (RAS)

and column address select (CAS) pins were discussed previously. However, with the chip of FIG. 14 mounted/fabricated/integrated/imbedded with TRA for wireless communication only 4-pins of power $V_{cc}$, $V_{cc}$, $V_{ss}$, $V_{ss}$ are needed, and all other data and control signals can be sent and received wirelessly.

FIG. 15 shows that the invented NVRAM is made up of MO or O bit read/write heads arranged in a two-dimensional grid placed on the surface of recordable, erasable, re-recordable SMO or SO media. In the operation of NVRAM of FIG. 15, a column is selected and then rows are charged to write data into or to read data from the specific column.

FURTHER EMBODIMENTS

Specific embodiments have been used to describe the invention. However, numerous modifications are possible as would be recognized by one skilled in the art. For instance, the descriptions in the above may make reference to specific ideal layout of components of wireless interconnects, it will be appreciated that various other arrangements could be implemented using any combination of hardware and/or software.

Although, the invention has been described with respect to specific embodiments, it will be appreciated that the invention is intended to cover all modifications and equivalents within the scope of the following claims.

What is claimed is:

1. A Multiprocessor Computing Apparatus (MCA) housed in a Metallic Enclosure (ME), comprising components of:
    Plurality of Processing Units (PUs) each with a local private memory (PM), and each mounted/fabricated/integrated/embedded with a transceiver and associated antenna (TRA),
    plurality of Shared Memory Units (SMUs) each mounted/fabricated/integrated/embedded with the TRA, and each made up of a Non-Volatile Random Access Memory (NVRAM) comprising a static Magneto-Optical or an Optical recordable, erasable, and re-recordable media in a square/rectangular form factor that can be written to and read from optically,
    plurality of peripheral components and/or inputs/outputs (I/Os) devices, each with an interface circuit mounted/fabricated/integrated/embedded with the TRA,
    wireless interconnect (WLI) for wireless communication, comprising a plurality of TRAs mounted/fabricated/integrated/embedded on components of the MCA, and an Electromagnetically Shielded and sealed confined free space within the ME and/or an Inside Metallic Enclosure (INSIDE-ME).

2. MCA as defined in claim 1, wherein a functional unit of a component Integrated Circuit (IC) of MCA is divided into sub-functional units that use WLIs for communication among/inter the sub-functional units.

3. MCA as defined in claim 1, wherein Printed Circuit Boards (PCBs) mounted with the components of MCA are mounted on sides/walls of the ME in a plane parallel to the respective side of the ME to provide for line of sight one-to-all and all-to-all wireless communications among the components of MCA through the electromagnetically shielded and sealed confined free space within the ME and/or the INSIDE-ME.

4. MCA as defined in claim 1, wherein the ME acts as heat-sink for all heat producing ICs including multiprocessor ICs that are attached to the ME from inside.

5. MCA as defined in claim 1, wherein outside surface of the ME is corrugated and/or finned for increasing heat dissipation surface area, and there are no cooling fans inside of the ME housing MCA.

6. MCA as defined in claim 1, wherein the ME is made waterproof and placed under water in a tank or a sea, or a lake, or a river preferably closer to the mouth of the river for cooling eliminating the need for air conditioning and refrigeration and saving electricity consumption in the operation of MCA to the extent of 50%.

7. MCA as defined in claim 1, wherein the ME is made dust proof and inside of the ME and/or the INSIDE-ME either vacuumed or filled with clean air without any suspended particles for more efficient and reliable wireless communications among the components of MCA.

8. MCA as defined in claim 1, wherein all inside surfaces including surfaces of the PCBs mounted on the walls of the ME, the mounted components on PCBs, and all inside surfaces of the INSIDE-ME are made rough to cause much of scattering and less of reflection of impinging electromagnetic waves/signals.

9. MCA as defined in claim 8, wherein all inside surfaces including surfaces of the PCBs mounted on the walls of the ME, the mounted components on PCBs, and all inside surfaces of the INSIDE-ME are coated with material that absorbs the impinging electromagnetic waves/signals, converts them into heat, and conducts it away to the ME that acts as heat sink.

10. An apparatus or equipment or a device housed in a ME (Metallic Enclosure), comprising:
    Plurality of different components and each mounted/fabricated/integrated/embedded with a TRA (Transceiver Antenna),
    wireless interconnect (WLI) comprising a plurality of TRAs mounted/fabricated/integrated/embedded on the components of the apparatus or the equipment or the device, and an Electromagnetically Shielded and sealed confined free space inside of the ME and/or an INSIDE-ME (Inside Metallic Enclosure),
    PCBs mounted with the components of the apparatus or the equipment or the device are mounted from inside on sides/walls of the ME in a plane parallel to the respective side/wall of the ME to provide for line of sight one-to-all and all-to-all wireless communications among the components of the apparatus or the equipment or the device through the electromagnetically shielded and sealed confined free space within the ME and/or the INSIDE-ME,
    the ME acts as heat-sink for all heat producing ICs that are attached to the ME from inside,
    the outside surface of the ME is corrugated and/or finned for increasing heat dissipation surface area, and there are no cooling fans inside of the ME housing MCA,
    the ME is made waterproof and placed submerged under water in a tank or a sea, or a lake, or a river preferably closer to the mouth of the river for cooling eliminating the need for air conditioning and refrigeration and saving electricity consumption in the operation of the apparatus or the equipment or the device to the extent of 50%,
    the ME is made dust proof and inside of the ME and/or the INSIDE-ME either vacuumed or filled with clean air without any suspended particles for more efficient and reliable wireless communications among the components of the apparatus or the equipment or the device,
    all inside surfaces of the ME including surfaces of the PCBs mounted on the walls of the ME, the mounted components on PCBs, and all inside surfaces of the INSIDE-ME are made rough to cause much of scattering and less of reflection of impinging electromagnetic waves/signals, all inside surfaces of the ME including surfaces of the PCBs mounted on the walls of the ME, the mounted components on PCBs, and all inside surfaces of the INSIDE-ME are coated with material that absorbs the impinging electromagnetic waves/signals, converts them into heat, and conducts it away to the ME that acts as a heat sink.

11. MCA as defined in claim 1, wherein the static NVRAM made up of the Magneto-Optical or the Optical recordable, erasable, and re-recordable media in the square/rectangular form factor that can be written to and read from optically further comprising:
- a grid of Magneto-Optical or Optical readers/writers placed on the surface of the Magneto-Optical or the Optical recording media that is erasable and re-recordable,
- the grid of the Magneto-Optical or the Optical readers/writers are connected by both horizontal row and vertical column lines,
- a horizontal row line connects to select terminal of a bit reader/writer head in its row; a vertical column line connects Data-In/Data-Out sense terminals of the bit reader/writer heads in its column,
- the vertical column and the horizontal row lines provide an address of group of bits constituting a word to be selected for simultaneous reading or writing of bits of the word.

12. The NVRAM as defined in claim 11 is packaged in an IC like that of a semiconductor memory with metallic pins attached for connection on the PCB to other circuit modules in the MCA or the equipment or the apparatus or the device.

13. The NVRAM as defined in claim 11 is organized in three layers,
- the first layer being that of the Magneto-Optical or the Optical recordable, erasable, and re-recordable media,
- the second layer being that of the grid of the Magneto-Optical or the Optical bit readers/writers placed on the surface of the recordable, erasable, and re-recordable media, and,
- the third layer being those of the vertical and the horizontal address and bit lines or an interconnect of type star, or tree, or mesh, or hypercube, or spherical hypercube or routing and switching network, or the WLI.

14. MCA as defined in claim 8, wherein all inside surfaces within ME and/or INSIDE-ME are made rough for the purpose of absorbing, scattering and reducing reflection of impinging Electromagnetic communication signals by having minute bumps and/or pores on the surfaces.

15. MCA as defined in claim 8, wherein all inside surfaces within ME and/or INSIDE-ME are made rough for the purpose of absorbing, scattering and reducing reflection of impinging Electromagnetic communication signals by sticking specially prepared Sponge, which is rough, porous, and soft, on the smooth surfaces.

16. MCA as defined in claim 8, wherein all inside surfaces within ME and/or INSIDE-ME are made rough for the purpose of absorbing, scattering and reducing reflection of impinging Electromagnetic communication signals by covering the surfaces with one, two, or more layers of coarsely woven soft, flexible, and thin fabric having pores between weaves, and the fabric could be made up of very fine, thin, and soft threads of cotton, synthetic, nylon, plastic, or rubber material.

17. MCA as defined in claim 8, wherein all inside surfaces within ME and/or INSIDE-ME are made rough for the purpose of absorbing, scattering and reducing reflection of impinging Electromagnetic communication signals by covering the surfaces with one, two, or more layers of mosquito net type soft and flexible thin fabric having holes of the net misaligned with respect to each layer, and the fabric could be made up of very fine, thin, and soft threads of cotton, synthetic, nylon, plastic, or rubber material.

* * * * *